United States Patent
Okada et al.

(10) Patent No.: US 11,962,314 B2
(45) Date of Patent: Apr. 16, 2024

(54) DIGITAL PHASE LOCKED LOOP CIRCUIT, DIGITALLY-CONTROLLED OSCILLATOR, AND DIGITAL-TO-TIME CONVERTER

(71) Applicant: SOCIONEXT INC., Kanagawa (JP)

(72) Inventors: Kenichi Okada, Tokyo (JP); Hanli Liu, Tokyo (JP); Zheng Sun, Tokyo (JP)

(73) Assignee: SOCIONEXT INC., Kanagawa (JP)

(*) Notice: Subject to any disclaimer, the term of this patent is extended or adjusted under 35 U.S.C. 154(b) by 331 days.

(21) Appl. No.: 17/400,851

(22) Filed: Aug. 12, 2021

(65) Prior Publication Data
US 2021/0376841 A1 Dec. 2, 2021

Related U.S. Application Data

(63) Continuation of application No. PCT/JP2020/005456, filed on Feb. 13, 2020.

(30) Foreign Application Priority Data

Feb. 15, 2019 (JP) .................. 2019-025792

(51) Int. Cl.
*H03L 7/099* (2006.01)
*G06F 1/06* (2006.01)
(Continued)

(52) U.S. Cl.
CPC .............. *H03L 7/0991* (2013.01); *G06F 1/06* (2013.01); *G06F 1/08* (2013.01); *H03K 5/01* (2013.01);
(Continued)

(58) Field of Classification Search
CPC ..... H03L 7/0991; H03L 2207/50; G06F 1/06; G06F 1/08; H03K 5/01; H03K 5/13; H03K 2005/00078; H03B 5/02
See application file for complete search history.

(56) References Cited

U.S. PATENT DOCUMENTS 9,306,614 B2 * 4/2016 Ragonese ............. H02M 3/338
2003/0222720 A1 12/2003 Sumita
(Continued)

FOREIGN PATENT DOCUMENTS

| JP | 2008-054323 A | 3/2008 |
| JP | 2013-042358 A | 2/2013 |
| JP | 2013-058881 A | 3/2013 |

OTHER PUBLICATIONS

International Search Report and Written Opinion issued in International Application No. PCT/JP2020/005456 dated May 19, 2020; with partial English translation.

*Primary Examiner* — Jeffrey M Shin

(74) *Attorney, Agent, or Firm* — Rimon P.C.

(57) ABSTRACT

With respect to a phase locked loop (PLL) circuit that receives a first reference clock and generates an output clock, the PLL circuit includes a delay circuit that delays the first reference clock to generate a second reference clock, a feedback circuit that generates a control signal based on a phase difference between the second reference clock and a feedback clock, an oscillator that oscillates at a frequency determined based on the control signal to generate the output clock, and a divider that divides the output clock in the on state. The PLL circuit switches between a first mode and a second mode, the feedback clock in the first mode is a signal obtained by retiming an output of the divider with the output clock, and the feedback clock in the second mode is a signal obtained by retiming the first reference clock with the output clock.

21 Claims, 23 Drawing Sheets

(51) Int. Cl.
  *G06F 1/08* (2006.01)
  *H03K 5/00* (2006.01)
  *H03K 5/01* (2006.01)
  *H03M 1/82* (2006.01)

(52) U.S. Cl.
  CPC .... *H03M 1/82* (2013.01); *H03K 2005/00078* (2013.01)

(56) References Cited

U.S. PATENT DOCUMENTS

| | | |
|---|---|---|
| 2011/0273210 A1 | 11/2011 | Nagaraj |
| 2014/0368285 A1* | 12/2014 | Lu ..................... H03B 5/1212 331/117 FE |
| 2017/0205772 A1* | 7/2017 | Burg .................... G04F 10/005 |
| 2019/0305608 A1* | 10/2019 | Pentakota ............. H01L 23/495 |

* cited by examiner $$N = K\sqrt{\frac{L_S}{L_P}}$$

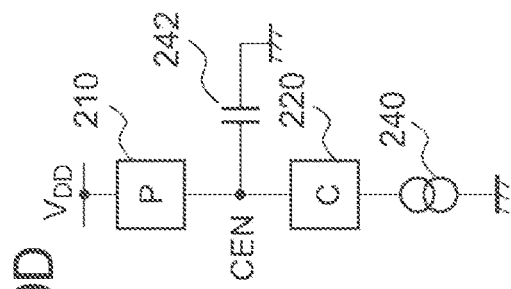
FIG.20A   FIG.20B
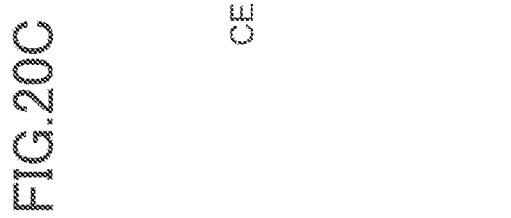
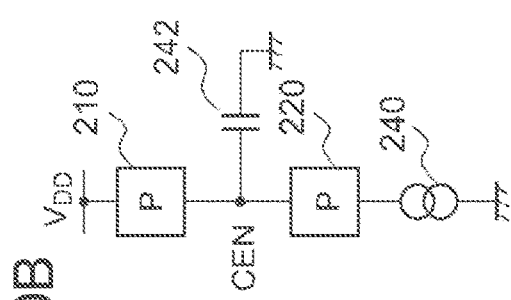
FIG.20C   FIG.20D
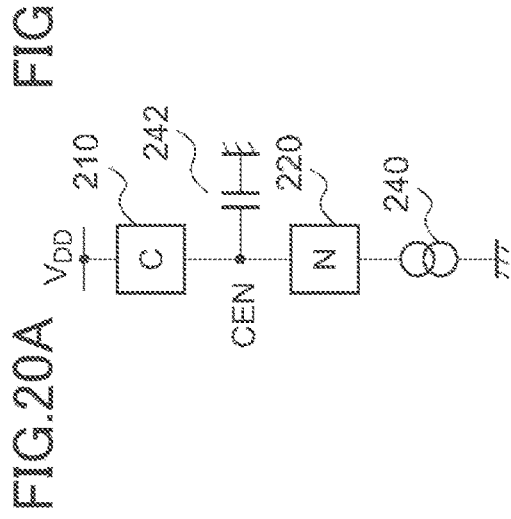
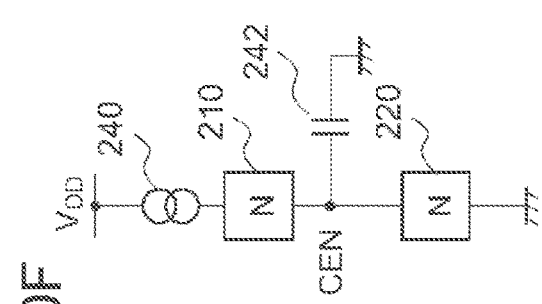
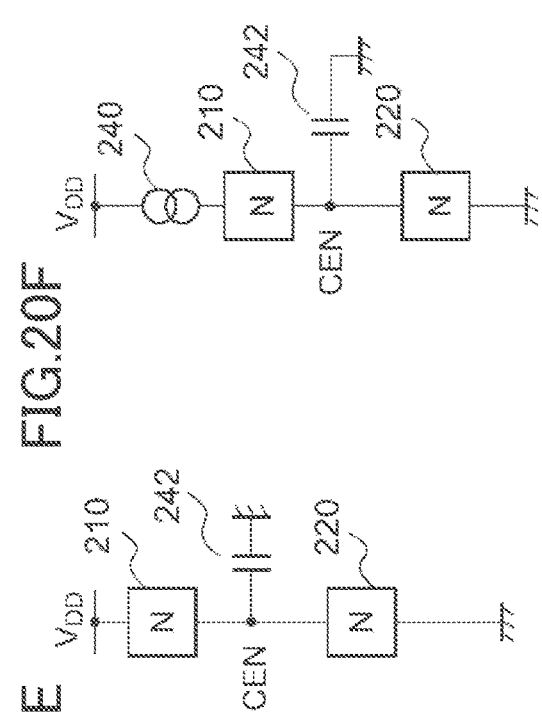
FIG.20E   FIG.20F

DIGITAL PHASE LOCKED LOOP CIRCUIT, DIGITALLY-CONTROLLED OSCILLATOR, AND DIGITAL-TO-TIME CONVERTER

CROSS-REFERENCE TO RELATED APPLICATIONS

The present application is a continuation application of International Application PCT/JP2020/005456 filed on Feb. 13, 2020 and designated the U.S., which is based upon and claims priority to Japanese Patent Application No. 2019-025792, filed on Feb. 15, 2019, the entire contents of which are incorporated herein by reference.

FIELD

The disclosure relates to a digital phase locked loop circuit, a digitally-controlled oscillator, and a digital-to-time converter.

BACKGROUND

A phase locked loop (PLL) circuit is used to multiply a reference clock to produce a clock of a desired frequency. As a form of a PLL circuit, a digital PLL circuit (D-PLL) is known.

FIG. 1 is a circuit diagram illustrating a basic architecture of a fractional-N D-PLL circuit 100R. The D-PLL circuit 100R receives a reference clock REF and a frequency control word (FCW) specifying a multiplication number and generates an output clock OUT by multiplying the reference clock REF based on the FCW.

The D-PLL circuit 100R includes a digital-to-time converter (DTC) 102, a time-to-digital converter (TDC) 104, a digital loop filter (DLF) 106, a digitally-controlled oscillator (DCO) 108, a buffer 110, a multi-modulus divider (MMD) 112, a controller 114, and a retiming circuit 116.

The DCO 108 oscillates at a frequency determined based on digital control data $D_{CNT}$. The output clock OUT of the DCO 108 is input to the MMD 112 through the buffer 110. The MMD 112 divides the output clock OUT by a division ratio set by the controller 114. The controller 114 is designed based on an architecture of a ΔΣ modulator. In the fractional-N PLL circuit, the controller 114 switches the division frequency ratio of the MMD 112 between multiple integer values in the time division in order to obtain a fractional multiplication ratio. The reciprocal of the average value of the division ratio set in the MMD 112 is a multiplication ratio $N_F$ of the D-PLL circuit 100R.

A division clock DIV obtained after the division is input to the retiming circuit 116. The retiming circuit 116 retimes the division clock DIV with the output clock CKV input through the buffer 110 to generate a feedback clock FB.

The DTC 102 applies a delay set by the controller 114 to the reference clock REF to output a reference clock REFA. The amount of the delay is selected in accordance with the division ratio provided to the MMD 112.

The TDC 104 converts a time difference between the reference clock REFA and the feedback clock FB into a digital value. The DLF 106 removes high frequency components of the output from the TDC 104 to generate the control data $D_{CNT}$.

The basic architecture of the D-PLL circuit 100R has been described above. FIG. 2 is a time chart of the D-PLL circuit 100R of FIG. 1. The division clock DIV is retimed with the clock CKV. With a sampling delay $\tau_{SAM}$ in the retiming circuit 116, an edge $E_1$ of the feedback clock FB is delayed by $\tau_{SAM}$ relative to an edge $E_2$ of the clock CKV. A feedback loop consisting of the TDC 104 and the DLF 106 performs feedback control so that a time difference between an edge $E_3$ of the reference clock REFA and the edge $E_1$ of the feedback clock FB becomes zero, and the phase is locked. At this time, the frequency of the output clock OUT (and the output clock CKV) of the DCO 108 is $N_F$ times greater than the frequency of the reference clock REFA (and the reference clock REF).

The D-PLL circuit 100R of FIG. 1 has advantages of the high frequency accuracy and robustness to frequency disturbance. However, because the MMD 112 and the retiming circuit 116 continue to operate in synchronization with the clock CKV, which is a high frequency, there is a problem of consuming a large power.

The present disclosure has been made in view of the above problem, and one exemplary object of the embodiment thereof is to provide a D-PLL circuit with reduced power consumption.

SUMMARY

An aspect of the present disclosure relates to a phase locked loop circuit that receives a first reference clock and generates an output clock. The phase locked loop circuit includes a delay circuit configured to delay the first reference clock to generate a second reference clock, a feedback circuit configured to generate a control signal based on a phase difference between the second reference clock and a feedback clock, an oscillator configured to oscillate at a frequency determined based on the control signal to generate the output clock, and a divider configured to switch between an on state and an off state, and divide the output clock in the on state. The phase locked loop circuit is configured to switch between a first mode and a second mode, the feedback clock in the first mode is a signal obtained by retiming an output of the divider with the output clock, and the feedback clock in the second mode is a signal obtained by retiming the first reference clock with the output clock.

An aspect of the present disclosure relates to a digital phase locked loop circuit that receives an input reference clock and a frequency control word and generates an output clock. The digital phase locked loop circuit includes a digital-to-time convertor configured to receive the input reference clock and generate a first reference clock, a delay circuit configured to delay the first reference clock to generate a second reference clock, a time-to-digital convertor configured to convert a phase difference between the second reference clock and the feedback clock into a digital signal, a digitally-controlled oscillator configured to oscillate at a frequency determined based on the digital signal output by the time-to-digital convertor to generate the output clock, and a divider configured to switch between an on state and an off state, and divide the output clock by a frequency division ratio corresponding to the frequency control word. The digital phase locked loop circuit is configured to switch between a first mode and a second mode, the feedback clock in the first mode is a signal obtained by retiming an output of the divider with the output clock, and the feedback clock in the second mode is a signal obtained by retiming the first reference clock with the output clock.

Another aspect of the present disclosure relates to a digitally-controlled oscillator. The digitally-controlled oscillator includes an upper unit and lower unit that are connected in series between a power line and a ground line, and a variable capacitor that is connected to at least one of the upper unit and the lower unit. Each of the upper unit and the lower unit includes a pair of cross-coupled circuit elements and an inductor connected to the pair of cross-coupled circuit elements. The inductor of the upper unit and the inductor of the lower unit are combined to form a trans-configuration.

Still another aspect of the present disclosure relates to a digital-to-time convertor. The digital-to-time convertor receives an input signal and applies a delay corresponding to a control code to generate an output signal. The digital-to-time convertor includes a slope generating circuit configured to generate a slope voltage, the slope generating circuit including a capacitor and a current source, a precharge circuit configured to apply an analog voltage corresponding to the control code to the capacitor, a comparing circuit configured to compare the slope voltage with a threshold value and generate the output signal based on a comparison result, and a control circuit configured to control the slope generating circuit and the precharge circuit based on the input signal and the output signal. The control circuit repeats the following operations: turning on the precharge circuit during a precharge period; transitioning to a slope period in response to transition of the input signal, turning off the precharge circuit and turning on the slope generating circuit during the slope period; and turning off the slope generating circuit in response to transition of the output signal.

Here, any combination of the above components and an aspect in which components or expressions of the present disclosure are mutually replaced between a method, a device, a system, and the like, can be considered as an aspect of the present disclosure.

BRIEF DESCRIPTION OF THE DRAWINGS

FIGS. 20A to 20F are circuit diagrams illustrating DCOs of additional modified examples;

DESCRIPTION OF EMBODIMENTS

Summary of Embodiments

Figure 1:
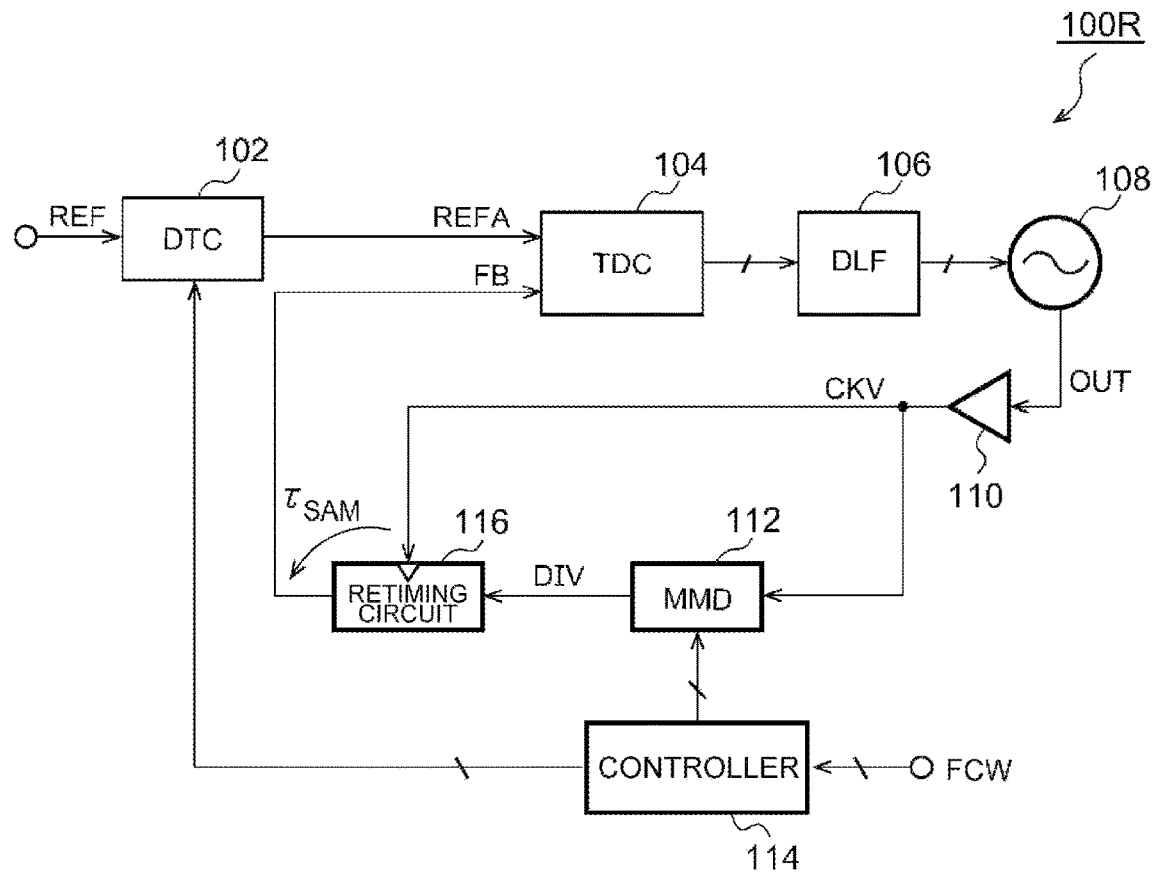
FIG. 1 is a circuit diagram illustrating a basic architecture of a fractional-N D-PLL circuit.

1. One embodiment disclosed in the present specification relates to a phase locked loop circuit that receives a first reference clock and generates an output clock. The phase locked loop circuit includes a delay circuit that delays the first reference clock to generate a second reference clock, a feedback circuit that generates a control signal based on a phase difference between the second reference clock and a feedback clock, an oscillator that oscillates at a frequency determined based on the control signal to generate the output clock, and a frequency divider that can switch between an on state and an off state and divides the output clock in the on state. The phase locked loop circuit can switch between a first mode and a second mode, and the feedback clock in the first mode is a signal obtained by retiming the output of the divider with the output clock. The feedback clock in the second mode is a signal obtained by retiming the first reference clock with the output clock.

According to this aspect, by selecting the second mode, the operation of the divider is stopped and the phase locking is performed by using the second reference clock as the feedback clock, thereby reducing power consumption. Additionally, if necessary, the first mode can be selected to restore a phase locked state when the phase lock is lost.

In one embodiment, the phase locked loop circuit may include a mode controller that generates an enable signal indicating a first mode or a second mode, a multiplexer that receives the output of the divider and the first reference clock and that selects one mode based on the enable signal, and a retiming circuit that retimes the output of the multiplexer with the output clock. The divider is controlled to switch between the on state and the off state based on the enable signal, and the output of the retiming circuit may be a feedback clock.

In one embodiment, the phase locked loop circuit may further include a dead zone detector that determines whether phase error between the second reference clock and the feedback clock is within a dead zone, and either the first mode or the second mode may be selected based on the output of the dead zone detector. This prevents the phase lock circuit from falling into a mode where the phase lock is not applied.

In one embodiment, the dead zone detector may include a phase frequency detector that compares phases or frequencies between the second reference clock and the feedback clock and outputs a pulse based on a comparison result, and a determining unit that generates the phase error based on the pulse output by the phase frequency detector and determines whether the phase error is within the dead zone.

In one embodiment, the phase locked loop circuit may further include a frequency lock loop that monitors a relation between the frequency of the output clock and the frequency of an input reference clock, and detects a frequency error in which the output clock deviates from a target frequency determined based on the division ratio. The first mode and the second mode may be selected based on the output of the frequency lock loop. This prevents the phase lock from being performed at a wrong frequency.

The frequency lock loop may include a counter that counts the output clock for a time period that is K times longer than the period of the input reference clock (where K is an integer). The frequency error may be detected based on a count value of the counter and a value obtained by multiplying the multiplication ratio, which is the reciprocal of the division ratio, by K.

In one embodiment, the phase locked loop circuit may further include a duty cycle controller that generates a control pulse having a predetermined duty cycle. The frequency lock loop may operate intermittently in response to the control pulse. The frequency lock loop operates intermittently, thereby suppressing an increase in power consumption.

In one embodiment, the phase locked loop circuit may further include a phase frequency detector that compares phases or frequencies between the second reference clock and the feedback clock and outputs a pulse based on a comparison result, and a phase locked loop (PLL) circuit that operates in the first mode and controls the frequency of the digitally-controlled oscillator based on the pulse output by the phase frequency detector. The accuracy of the feedback loop including the phase frequency detector and the PLL circuit may be coarser than the accuracy of the feedback circuit. This enables the phase locked loop circuit to transition to the phase locked state quickly from the state in which the phase lock is lost.

The phase locked loop circuit may be a digital phase locked loop circuit. The feedback circuit may include a time-to-digital converter that converts a phase difference between the second reference clock and the feedback clock into a digital signal. The oscillator may be a digitally-controlled oscillator that oscillates at a frequency determined based on the digital signal output by the time-to-digital converter.

The phase locked loop circuit may be a fractional-N phase locked loop circuit. The divider may be a multi-modulus divider. The phase locked loop circuit may further include a digital-to-time converter that receives the input reference clock and generates the first reference clock, and a controller that controls the digital-to-time converter and the multi-modulus divider based on the frequency control word that specifies the frequency of the output clock.

2. Another aspect of the disclosure is a digitally-controlled oscillator. The digitally-controlled oscillator includes an upper unit and a lower unit that are connected in series between a power line and a ground line, and a variable capacitor connected to at least one of the upper unit and the lower unit. Each of the upper and lower units includes a pair of circuit elements that are cross-coupled and an inductor connected to the pair of circuit elements. The inductors of the upper and lower units are combined to form a trans-configuration.

With this configuration, due to the effect of the gain amplification caused by the trans-configuration, the bias current required to obtain the same amplitude can be reduced or the amplitude obtained when the bias current is maintained can be increased.

At least one of the upper and lower units may be an N-type unit in which the pair of circuit elements is an N-channel metal oxide semiconductor (NMOS) transistor. Each of the upper and lower units may be the NMOS unit.

At least one of the upper and lower units may be a P-type unit in which the pair of circuit elements is a P-channel metal oxide semiconductor (PMOS) transistor.

At least one of the upper and lower units may be a CMOS-type unit in which the pair of circuit elements is a complementary metal oxide semiconductor (CMOS) inverter.

The digitally-controlled oscillator may further include a bias current source that is inserted between the power line and the ground line.

The digitally-controlled oscillator may further include a capacitor connected to connection nodes of the upper and lower units.

3. Still another aspect of the present disclosure is a digital-to-time converter. The digital-to-time converter receives an input signal, applies a delay determined based on the control code, and generates an output signal. The digital-to-time converter includes a slope generating circuit, including a capacitor and a current source, that generates a slope voltage, a precharge circuit that applies an analog voltage, determined based on the control code, to the capacitor, a comparing circuit that compares the slope voltage with a threshold value and generates an output signal based on a comparison result, and a control circuit that controls the slope generating circuit and the precharge circuit in response to transition of the input signal and the output signal. The control circuit repeats the following operations: turning on the precharge circuit during a precharge period; transitioning to the slope period in response to the transition of the input signal; turning off the precharge circuit during the slope period; and turning on the slope generation circuit, and turning off the slope generation circuit in response to the transition of the output signal.

According to this embodiment, power consumption can be reduced by suppressing wasted charge and discharge of the capacitor.

The comparing circuit is configured to switch between the on state and the off state, and the control circuit may turn off the comparing circuit during the precharge period.

Embodiments

In the following, the embodiments of the present disclosure will be described with reference to the drawings. The same or equivalent components, members, and processes illustrated in each drawing are referenced by the same reference character and the overlapping description is omitted, as appropriate. Additionally, the embodiments are examples and do not limit the disclosure. All features described in the embodiments and combinations thereof are not necessarily essential in the disclosure.

In the present specification, "a state in which a member A is connected to a member B" includes a case in which the member A is physically directly connected to the member B, and a case in which the member A is indirectly connected to the member B through another member that does not substantially affect an electrical connection state of the member A and the member B or that does not impair a function or effect of the combination of the member A and the member B.

Similarly, "a state in which a member C is provided between a member A and a member B" includes a case in which the members A and C, or the members B and C, are directly connected, and a case in which the members A and C, or the members B and C are indirectly connected through another member that does not substantially affect an electrical connection state thereof or that does not impair a function or effect of the combination thereof.

(D-PLL circuit)

Figure 3:
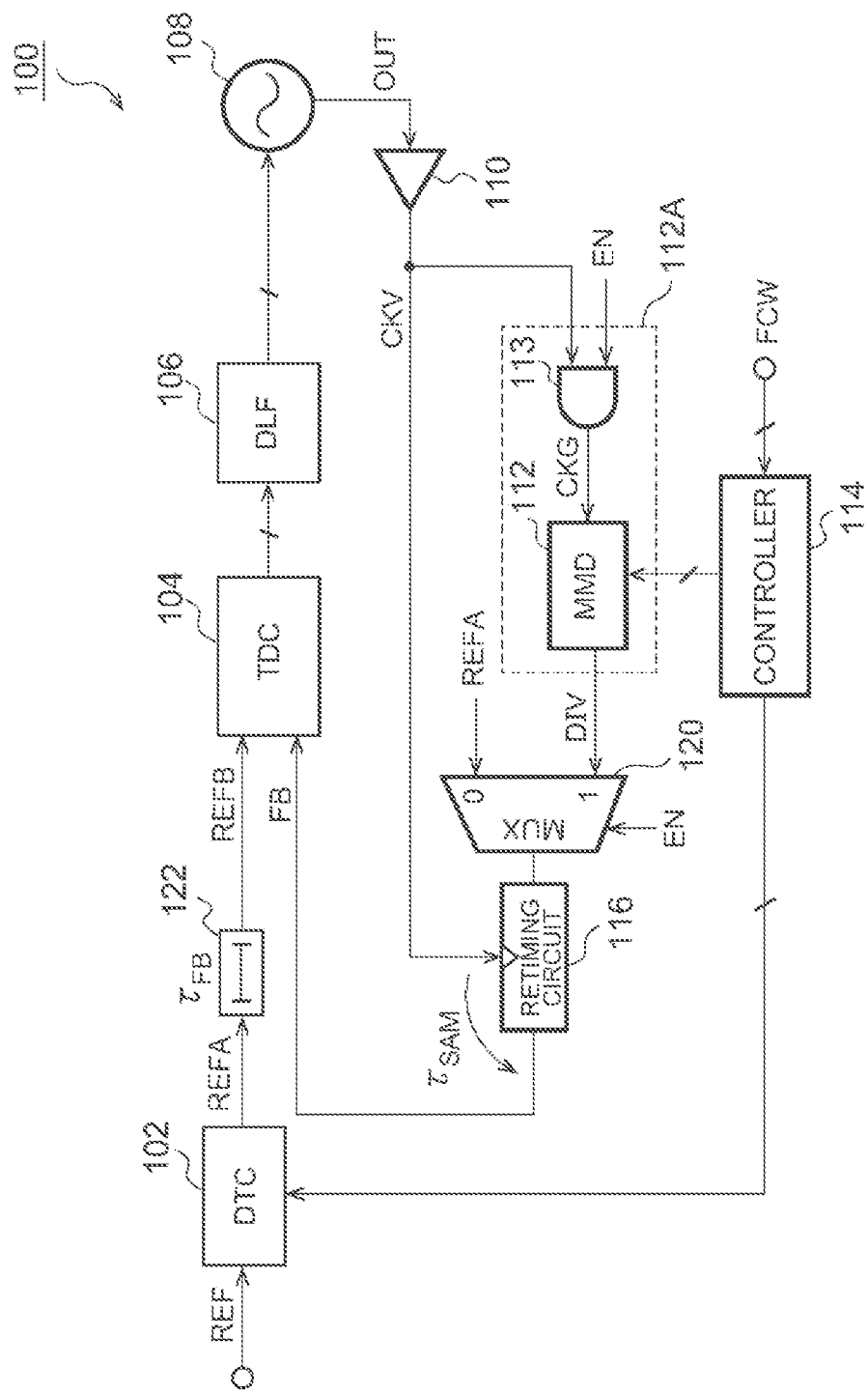
FIG. 3 is a circuit diagram illustrating a basic architecture of a D-PLL circuit according to an embodiment.

FIG. 3 is a circuit diagram illustrating a basic architecture of a D-PLL circuit 100 according to the embodiment. The D-PLL circuit 100 is a fractional-N PLL circuit. The D-PLL circuit 100 receives an input reference clock REF and a frequency control word FCW, and generates an output clock OUT having a frequency that is a fraction of a frequency F of the input reference clock REF The D-PLL circuit 100 further includes a multiplexer 120, a delay circuit 122, and a mode selector 130 (which is not illustrated) in addition to the D-PLL circuit 100R of FIG. 1. Additionally, the MMD 112A is configured to switch between "enable" and "disable" (i.e., an on state and an off state).

The D-PLL circuit 100 can switch between two modes (referred to as a sampling mode and a subsampling mode), and one of the two modes is selected based on an enable signal EN. If the enable signal EN is 1 (a high level), the D-PLL circuit 100 is set to the sampling mode, and if the enable signal EN is 0 (a low level), the D-PLL circuit 100 is set to the subsampling mode.

The multiplexer 120 receives a division clock DIV that is output by the MMD 112, and a first reference clock REFA that is output by the DTC 102, and selects either the division clock DIV or the first reference clock REFA based on the enable signal EN. The output of the multiplexer 120 is retimed by the retiming circuit 116 to provide a feedback clock FB. An output clock CKV input through a buffer 110 can be used for the retiming. Here, if the output impedance of the DCO 108 is sufficiently low, the buffer 110 may be omitted.

If the enable signal EN is 1 (a high level), the feedback clock FB is generated based on the division clock DIV, and if the enable signal EN is 0 (a low level), the feedback clock FB is generated based on the first reference clock REFA.

The function of the MMD 112A is the same as that of FIG. 1, but is configured to switch between the on state and the off state based on the enable signal EN. For example, the MMD 112A includes a gate circuit 113 in addition to the MMD 112 of FIG. 1. The gate circuit 113 is inserted in a stage prior to the MMD 112 to gate the clock CKV based on the enable signal EN. That is, if the enable signal EN is 1, a clock CKG passing through the gate circuit 113 is input to the MMD 112 and the MMD 112 is enabled. If the EN signal is 0, the clock CKG is fixed at a low level, and thus the MMD 112 is disabled.

The delay circuit 122 is inserted in a stage subsequent to the DTC 102 to apply a delay $\tau_{FB}$ to the first reference clock REFA and to output a second reference clock REFB. The TDC 104 performs the feedback so that the edge of the second reference clock REFB matches the edge of the feedback clock FB.

The mode selector 130 generates the enable signal EN based on the operating state of the D-PLL circuit 100 and controls the mode of the D-PLL circuit 100.

Figure 4:
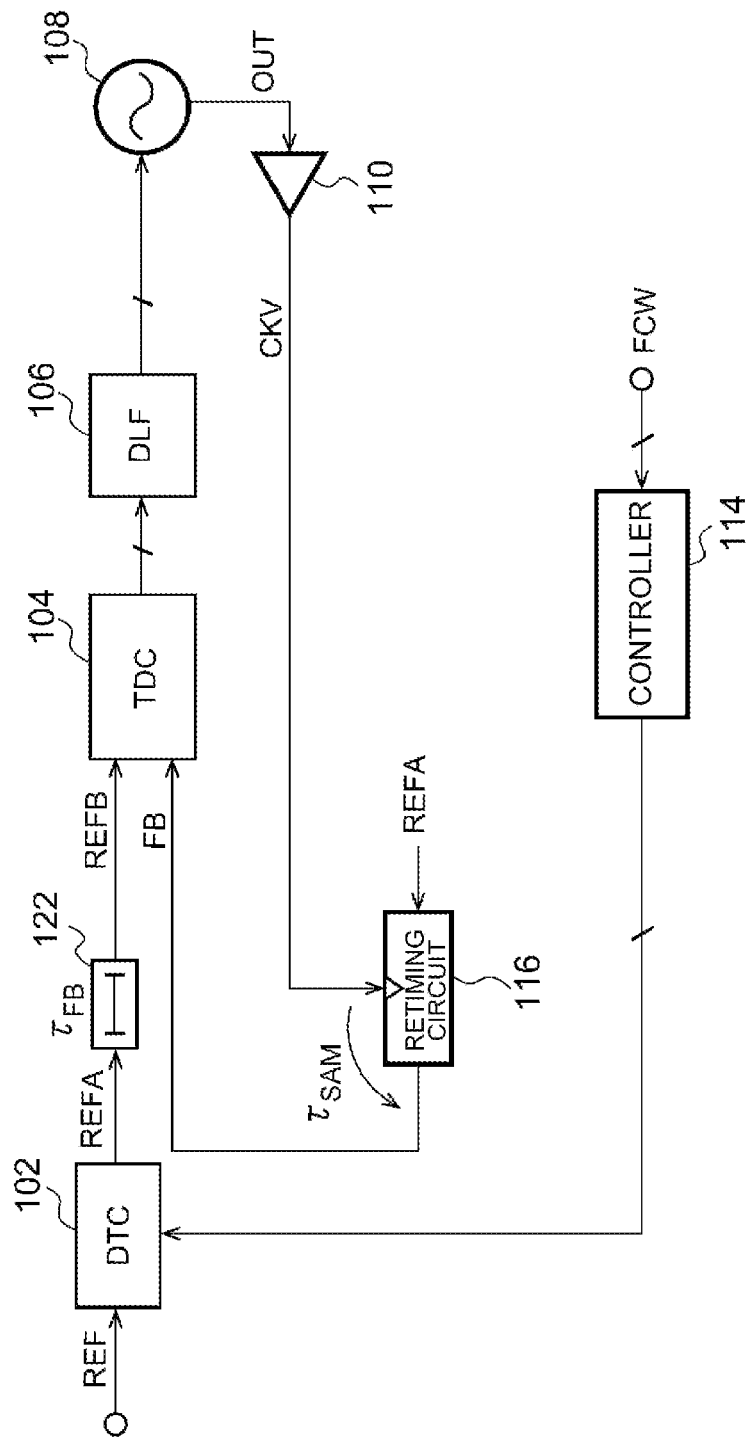
FIG. 4 is an equivalent circuit diagram of the D-PLL circuit in a subsampling mode (an enable signal EN=0)

The basic configuration of the D-PLL circuit 100 has been described above. Next, the operation will be described. FIG. 4 is an equivalent circuit diagram of the D-PLL circuit 100 in the subsampling mode (the enable signal EN=0). In the subsampling mode, the operation of the MMD 112 is stopped. Because the frequency of the first reference clock REFA is equal to the frequency of the division clock DIV, the first reference clock REFA is input to the retiming circuit 116 instead of the division clock DIV. Then, the retiming circuit 116 retimes the first reference clock REFA at the edge of the clock CKV to generate the feedback clock FB.

Figure 5:
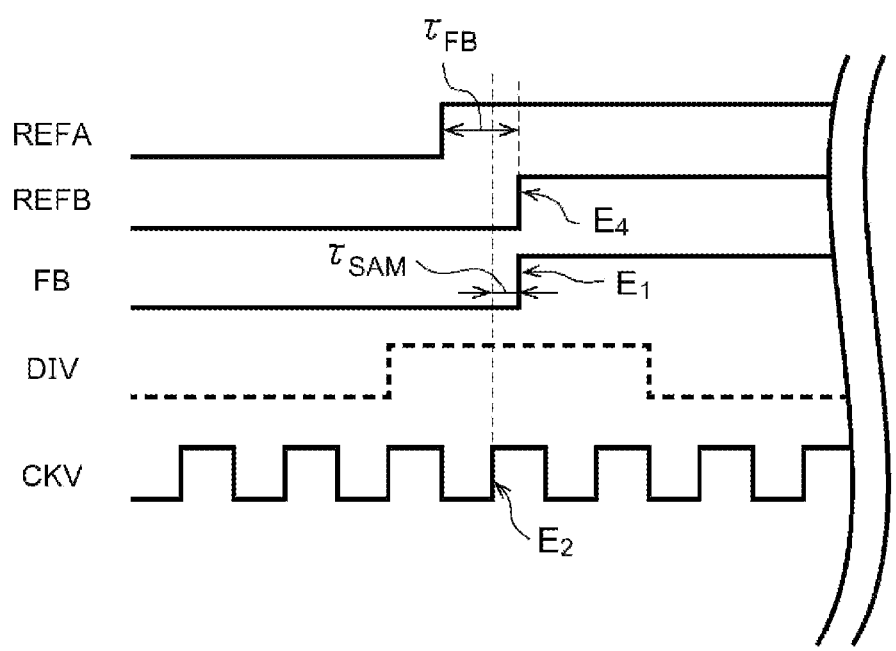
FIG. 5 is a time chart of the D-PLL circuit in the subsampling mode.

FIG. 5 is a time chart of the D-PLL circuit 100 in the subsampling mode. In the subsampling mode, the first reference clock REFA is retimed with the clock CKV instead of the division clock DIV. Due to the sampling delay $\tau_{SAM}$ in the retiming circuit 116, the edge $E_1$ of the feedback clock FB is delayed by $\tau_{SAM}$ relative to the edge $E_2$ of the clock CKV. A feedback loop including the TDC 104 and the DLF 106 performs the feedback so that a time difference between an edge $E_4$ of the second reference clock REFB and the edge $E_1$ of the feedback clock FB becomes zero, and the phase is locked.

In the subsampling mode, due to the relation in which the feedback clock FB is generated by the retiming of the first reference clock REFA, the edge of the feedback clock FB is delayed in comparison with the edge of the first reference clock REFA. Thus, even if the feedback is performed, the edge (phase) of the feedback clock FB cannot match the edge of the first reference clock REFA. Therefore, by considering a phase delay caused when the feedback clock FB is generated by the retiming, a delay amount $\tau_{FB}$ of the delay circuit 122 is set to cancel the phase delay, so that the phase of the second reference clock REFB (=REFA+$\tau_{FB}$) and the phase of the feedback clock FB (=REFA+$\Delta\tau$+$T_{SAM}$) delayed by the retiming are included within one period of the clock CKV, and the phase lock can be performed.

Figure 2:
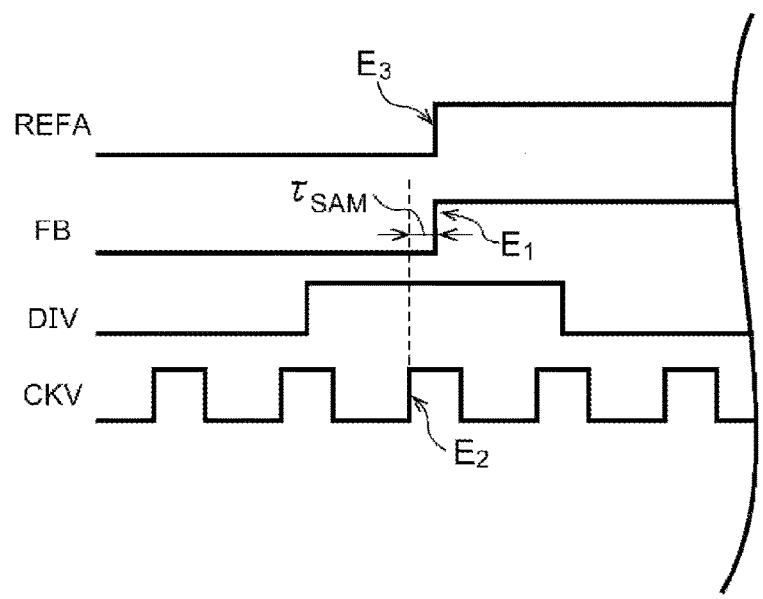
FIG. 2 is a time chart of the D-PLL circuit of FIG. 1.
Figure 6A:
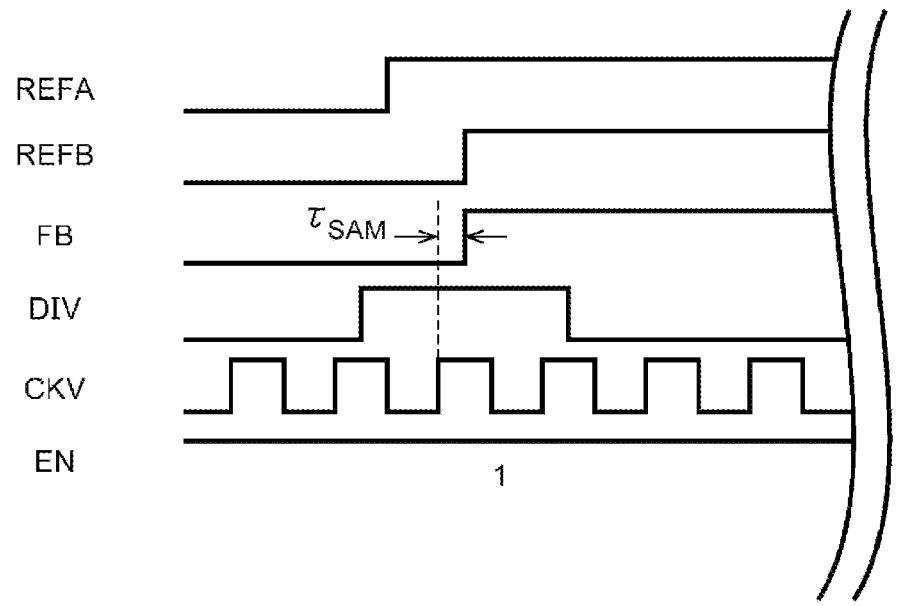
FIG. 6A and FIG. 6B are time charts contrasting operations of the D-PLL circuit in a sampling mode and the subsampling mode.
Figure 6B:
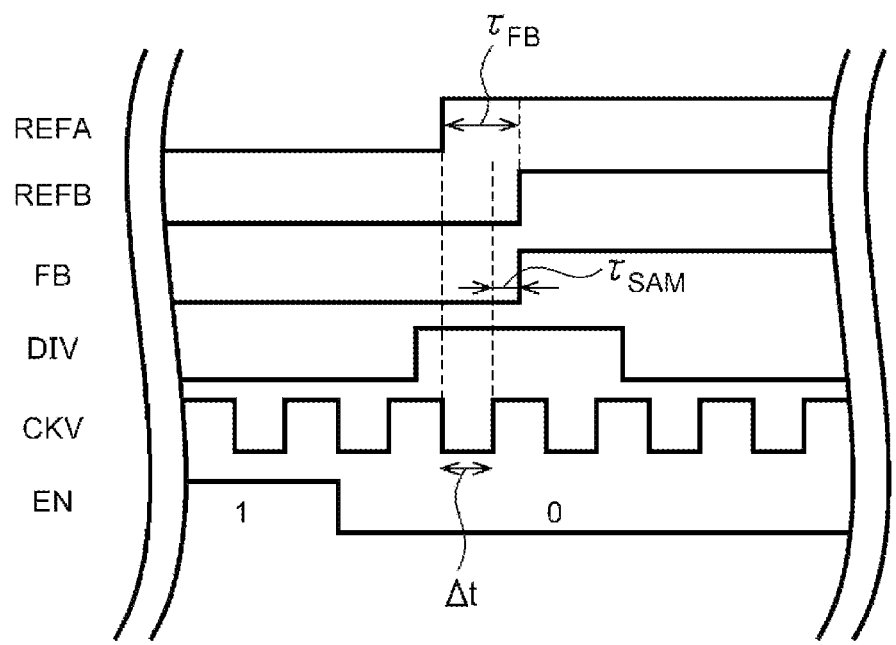

FIG. 6A and FIG. 6B are time charts contrasting the operations of the D-PLL circuit 100 in the sampling mode and in the subsampling mode. The operation of the sampling mode of FIG. 6A is substantially the same as that of FIG. 2. The difference is that the phase of the feedback clock FB is locked with respect to the phase of the second reference clock REFB, instead of the first reference clock REFA. The operation of the sub-sampling mode in FIG. 6B is substantially the same as that in FIG. 5.

The operation of the D-PLL circuit 100 has been described above. Next, the advantage will be described. When the D-PLL circuit 100 operates in the subsampling mode, the operation of the MMD 112 is stopped, so that power consumption can be significantly reduced in comparison with the sampling mode.

Here, in the subsampling mode, after an output frequency $f_{OUT}$ of the output clock OUT is locked to the target value (=$f_{REF}$×N), the phase lock can be maintained at low power consumption, but the state cannot be transitioned from a state $f_{OUT}$≠$f_{REF}$×N to a state $f_{OUT}$=$f_{REF}$×N. This is because the multiplication ratio N is not involved in the circuit operation because the MMD 112 is not used.

Thus, the mode selector 130 monitors the operation state of the D-PLL circuit 100, and, at the time of startup or when the phase lock is lost, temporarily sets the enable signal EN to a high level (1) in order to set the sampling mode, so that the state can be transitioned to the state $f_{OUT}$=$f_{REF}$×N.

The basic architecture of the D-PLL circuit 100 according to the embodiment has been described. Next, a specific implementation of the D-PLL circuit 100 will be described with reference to embodiments.

Figure 7:
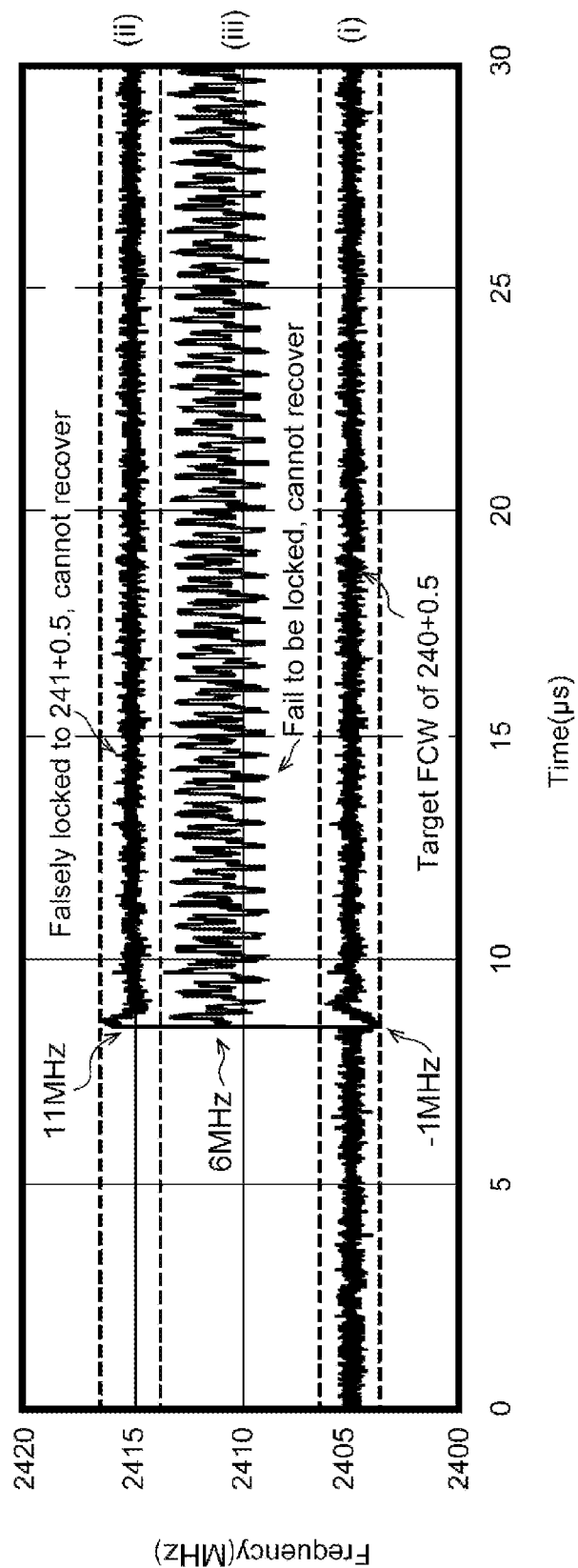
FIG. 7 is a waveform chart of an output frequency $f_{OUT}$ of the D-PLL circuit in the subsampling mode.

First, a problem that may occur in the subsampling mode will be described. FIG. 7 is a waveform chart (simulation) of the output frequency $f_{OUT}$ of the D-PLL circuit 100 in the subsampling mode, where $f_{REF}$=10 MHz, N=240+0.5. In the phase locked state, the output frequency $f_{OUT}$ is stabilized at 2405 MHz (=2.405 GHz).

In FIG. 7, waveforms (i) to (iii), in which −1 MHz, +6 MHz and +11 MHz frequency interferences are respectively introduced, are illustrated. As illustrated in (i), if the −1 MHz frequency interference is introduced, the phase locked state can be maintained.

In the sub-sampling mode, due to the retiming of the first reference clock REFA, which is wide, with the clock CKV, the edge of the clock CKV used for the retiming shifts back and forth. Therefore, as illustrated in (ii) of FIG. 7, a state where N'=241+0.5 may be falsely locked. Alternatively, as illustrated in (iii) of FIG. 7, there may be a situation where the phase lock is not applied and the frequency varies.

That is, the mode selector 130 is required to be implemented to monitor the state of the D-PLL circuit 100 to control the mode of the D-PLL circuit 100 so as not to fall into the conditions (ii) and (iii) of FIG. 7.

Another Embodiment

Figure 8:
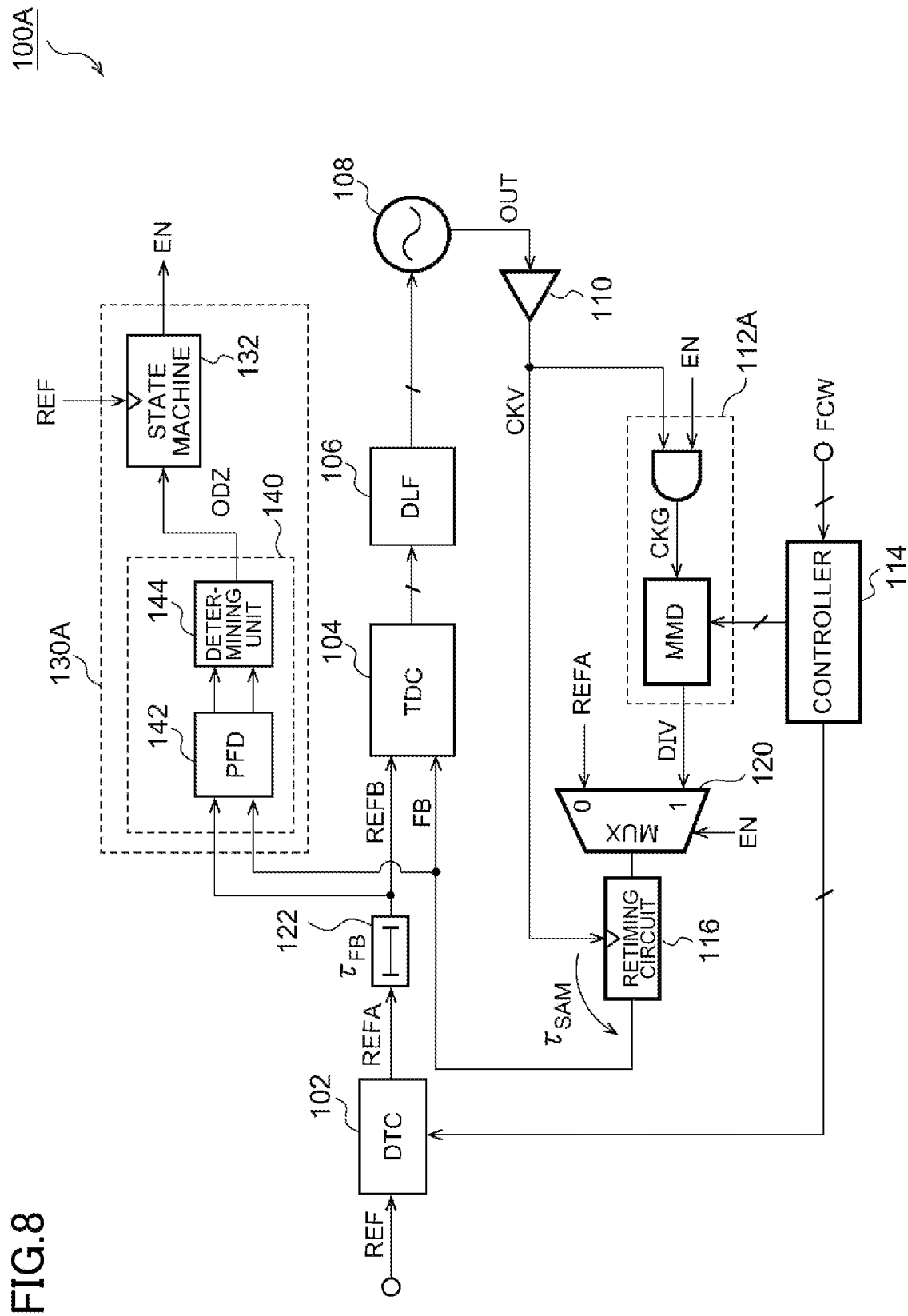
FIG. 8 is a circuit diagram of a D-PLL circuit according to another embodiment.

FIG. 8 is a circuit diagram of a D-PLL circuit 100A according to another embodiment. In the present embodiment, a mode selector 130A is configured to detect a non-phase locked state, as illustrated in the waveform (iii) of FIG. 7.

The mode selector 130A includes a dead zone detector 140 and a state machine 132. The dead zone detector 140 determines whether phase error $t_{ERR}$ between the second reference clock REFB and the feedback clock FB is within a dead zone $t_{DZ}$. The dead zone detector 140 generates a detection signal ODZ (out of dead zone) indicating a first level (e.g., a high level or 1) if the phase error $t_{ERR}$ is not within the dead zone $t_{DZ}$, and generates the detection signal ODZ indicating a second level (e.g., a low level or 0) if the phase error $t_{ERR}$ is within the dead zone $t_{DZ}$.

The configuration of the dead zone detector 140 is not particularly limited, but the dead zone detector 140 includes, for example, a phase frequency detector (PFD) 142 and a determining unit 144. The PFD 142 compares the phases or the frequencies of the second reference clock REFB and the feedback clock FB and outputs one of two pulses (i.e., either a pulse UP or a pulse DN) based on a comparison result.

The determining unit 144 receives the pulse UP or the pulse DN output by the PFD 142 and generates the phase error $t_{ERR}$ based on the received pulses. The determining unit 144 determines whether the phase error $t_{ERR}$ is within the dead zone, and outputs an ODZ signal.

The state machine 132 synchronizes the ODZ signal with the reference clock REF to generate the enable signal EN. The state machine 132 may be configured by a flip-flop.

Figure 9A:
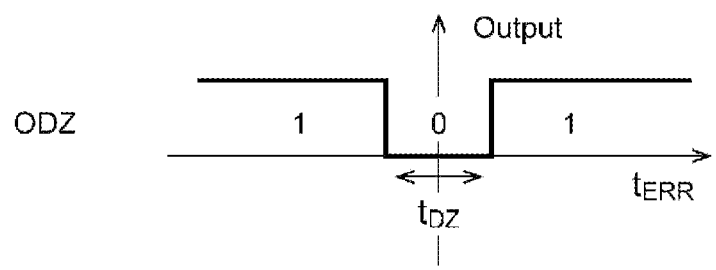
FIG. 9A and FIG. 9B are diagrams illustrating an operation of a mode selector in the D-PLL circuit of FIG. 8.
Figure 9B:
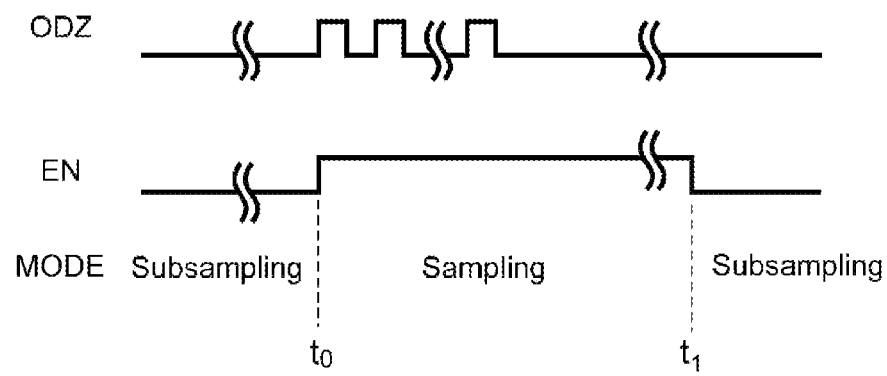

The configuration of the D-PLL circuit 100A has been described above. Next, the operation will be described. FIG. 9A and FIG. 9B are diagrams illustrating an operation of the mode selector 130A in the D-PLL circuit 100A of FIG. 8. FIG. 9A illustrates the I/O characteristics of the dead zone detector 140.

FIG. 9B illustrates an entire operation of the D-PLL circuit 100A. Before the time t0, the D-PLL circuit 100A operates in the sub-sampling mode. If, for some reason, the phase error $t_{ERR}$ between the feedback clock FB and the reference clock REFB deviates from the dead zone $t_{DZ}$, the ODZ signal periodically becomes a high level and the enable signal EN becomes a high level (1). As a result, the D-PLL circuit 100A switches to the sampling mode. When operating in the sampling mode, the phase error $t_{ERR}$ decreases and returns within the dead zone $t_{DZ}$ at the time $t_1$, and the ODZ signal returns to a low level. Consequently, the enable signal EN becomes low, and the D-PLL circuit 100A switches to the subsampling mode.

The operation of the D-PLL circuit 100A has been described above. By implementing the dead zone detector 140 and operating the dead zone detector 140 in the background, a situation in which the phase lock cannot be performed, as illustrated in (iii) of FIG. 7, can be prevented.

Still Another Embodiment

Figure 10:
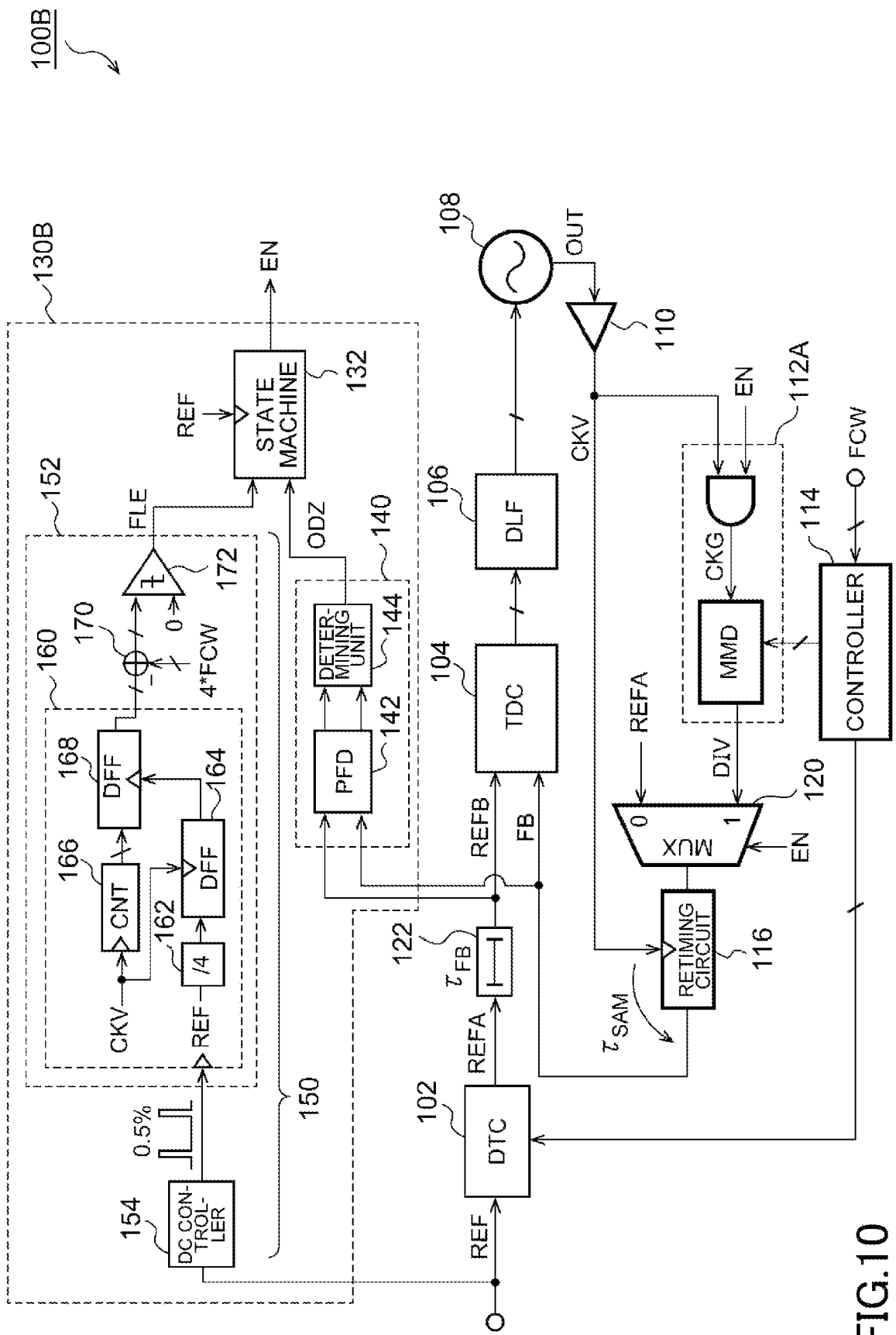
FIG. 10 is a circuit diagram of a D-PLL circuit according to still another embodiment.

FIG. 10 is a circuit diagram of a D-PLL circuit 100B according to still another embodiment. In the present embodiment, a mode selector 130B is configured to detect an integer multiple of frequency jump, as illustrated in the waveform (ii) of FIG. 7.

The mode selector 130B includes an intermittent operation frequency locked loop (FLL) 150, in addition to the dead zone detector 140 and the state machine 132. The intermittent operation FLL is also referred to as the duty cycled FLL (DC-FLL).

The intermittent operation FLL 150 includes an FLL 152 and a duty cycle controller 154.

The FLL 152 is configured to switch between "enable" and "disable". In the enabled state, the FLL 152 monitors a relation between the frequency of the clock CKV (i.e., the output clock OUT) and the frequency of the reference clock REF, and asserts (e.g., changes to a high level) a frequency lock error signal FLE when the frequency of the clock CKV deviates from a target frequency determined based on the FCW. In other words, the FLL 152 monitors how many times the period of the reference clock REF is the period of the clock CKV, and determines whether a monitored result matches the multiplication ratio based on the FCW. The state machine 132 switches the enable signal EN to a high level in response to the assertion of the frequency lock error signal FLE.

The configuration of the FLL 152 is not limited, but, for example, the FLL 152 may include a frequency detector 160, a subtractor 170, and a comparator 172. The frequency detector 160 counts the clock CKV during an integer multiple of the period of the reference clock REF (K=4 in this example). In a state in which the frequency is locked, the count value is K times greater than the FCW (i.e., the multiplication number).

The frequency detector 160 includes a divider 162, D flip-flops 164 and 168, and a counter 166. The divider 162 multiplies the reference clock REF by 1/K (K=4). The divided clock is synchronized with the clock CKV at the flip-flop 164. The counter 166 counts the number of pulses of the clock CKV. The flip-flop 168 obtains the count value of the counter 166 at the timing of the output of the divider 162. The output of the flip-flop 168 indicates how many clocks CKV are included during a period that is K times greater than the period of the reference clock REF.

The subtractor 170 calculates a difference (frequency error) between the output of the flip-flop 168 and the target value (i.e., K×FCW). The comparator 172 compares the output of the subtractor 170 with a threshold value and asserts the frequency lock error signal FLE when the frequency error exceeds the tolerance.

Because the FLL 152 includes the counter 166 that operates on a high frequency signal ($f_{OUT}$=2.4 GHz), constant operation increases power consumption. Thus, the duty cycle controller 154 generates a control pulse DC having a predetermined duty cycle and the FLL 152 is intermittently operated based on the control pulse DC. For example, the duty cycle may be 1% or less, and may be for example, about 0.5%. This can reduce power consumption of the FLL 152.

Figure 11:
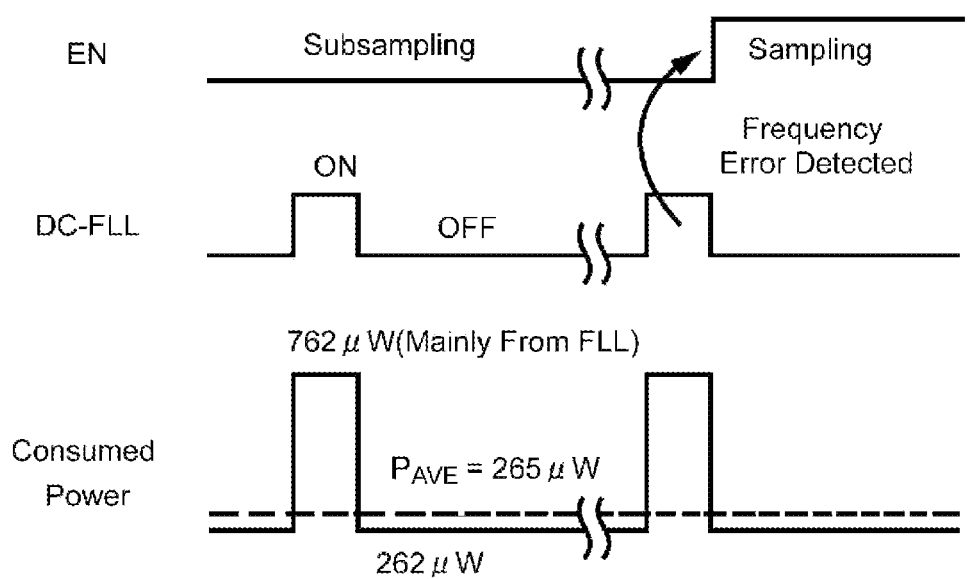
FIG. 11 is a diagram illustrating an operation of a mode selector in the D-PLL circuit.

The configuration of the D-PLL circuit 100B has been described above. Next, the operation will be described. FIG. 11 is a diagram illustrating an operation of the mode selector 130B in the D-PLL circuit 100B.

The intermittent operation FLL 150 repeats the on state and the off state at a predetermined period. When the frequency error is detected during the on period, the D-PLL circuit 100B switches to the sampling mode and operates to lock the frequency.

In FIG. 11, the consumed power of the D-PLL circuit 100B is illustrated. The consumed power while the intermittent operation FLL 150 (i.e., the DC-FLL) is stopped is, for example, 262 μW. During the operation of the intermittent operation FLL 150, the consumed power of the D-PLL circuit 100B jumps up (e.g., 762 μW), but when the duty cycle is 0.5%, the average consumed power $P_{AVE}$ is 265 μW, and an increase in the consumed power can be suppressed to only 3 μW.

The operation of the D-PLL circuit 100B has been described above. According to the mode selector 130B, an integer multiple of a frequency jump can be detected. In this case, the D-PLL circuit 100B operates in the sampling mode, so that the phase lock can be prevented from continuing in a false state as illustrated in (ii) of FIG. 7. Because the mode selector 130B of FIG. 10 includes the dead zone detector 140 in addition to the intermittent operation FLL 150, falling into the state of FIG. 7 (iii) can be prevented as in another embodiment.

Figure 12:
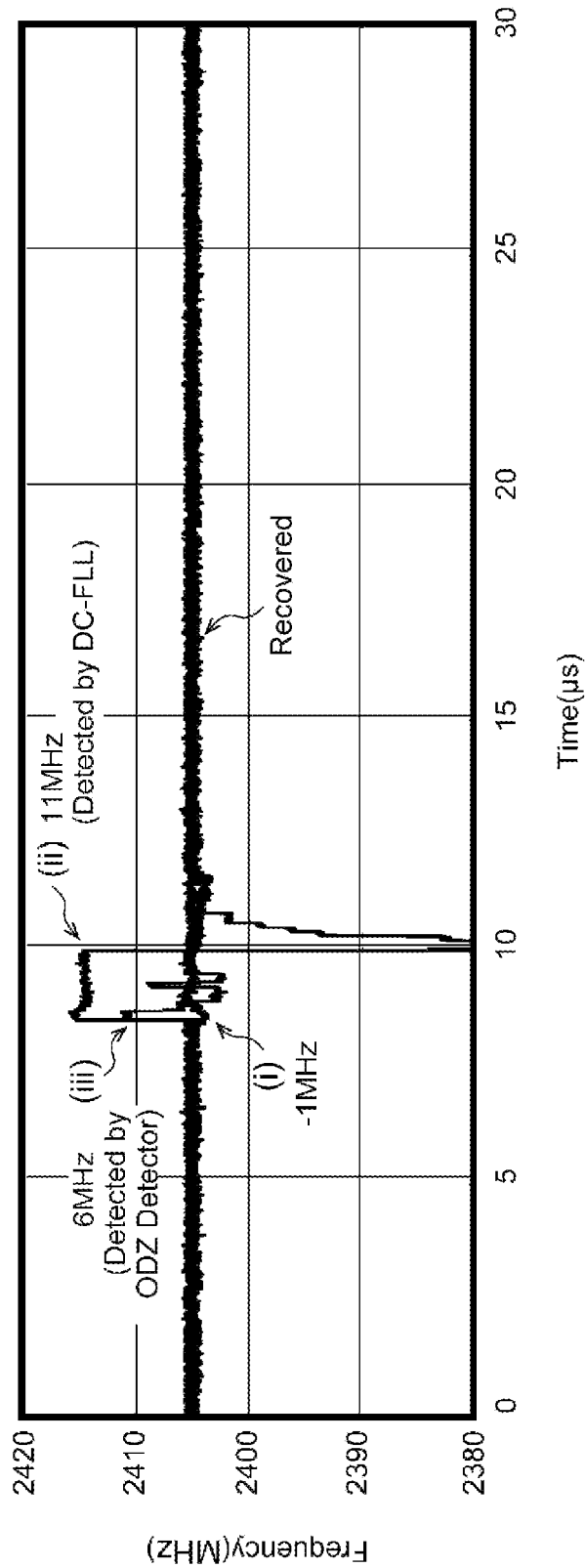
FIG. 12 is a waveform chart of the output frequency $f_{OUT}$ of the D-PLL circuit of FIG. 8.

FIG. 12 is a waveform chart (simulation) of the output frequency $f_{OUT}$ of the D-PLL circuit 100B of FIG. 8. As in FIG. 7, waveforms (i) to (iii) in which frequency interferences of −1 MHz, +6 MHz and +11 MHz are respectively introduced are illustrated. As illustrated in (i), if the −1 MHz frequency interference is introduced, the phase locked state can be maintained.

As illustrated in (ii), if the +11 MHz frequency interference is introduced, the intermittent operation FLL 150 detects the abnormal condition and the D-PLL circuit 100B switches to the sampling mode to return to the correct phase locked condition. Here, in the waveform (ii), the high frequency state continues for a while. This is a detection delay due to the intermittent operation of the intermittent operation FLL 150.

As illustrated in (iii), if the +6 MHz frequency interference is introduced, the dead zone detector 140 detects the abnormal condition and the D-PLL circuit 100B switches to the sampling mode to return to the correct phased lock condition.

Further Still Another Embodiment

Figure 13:
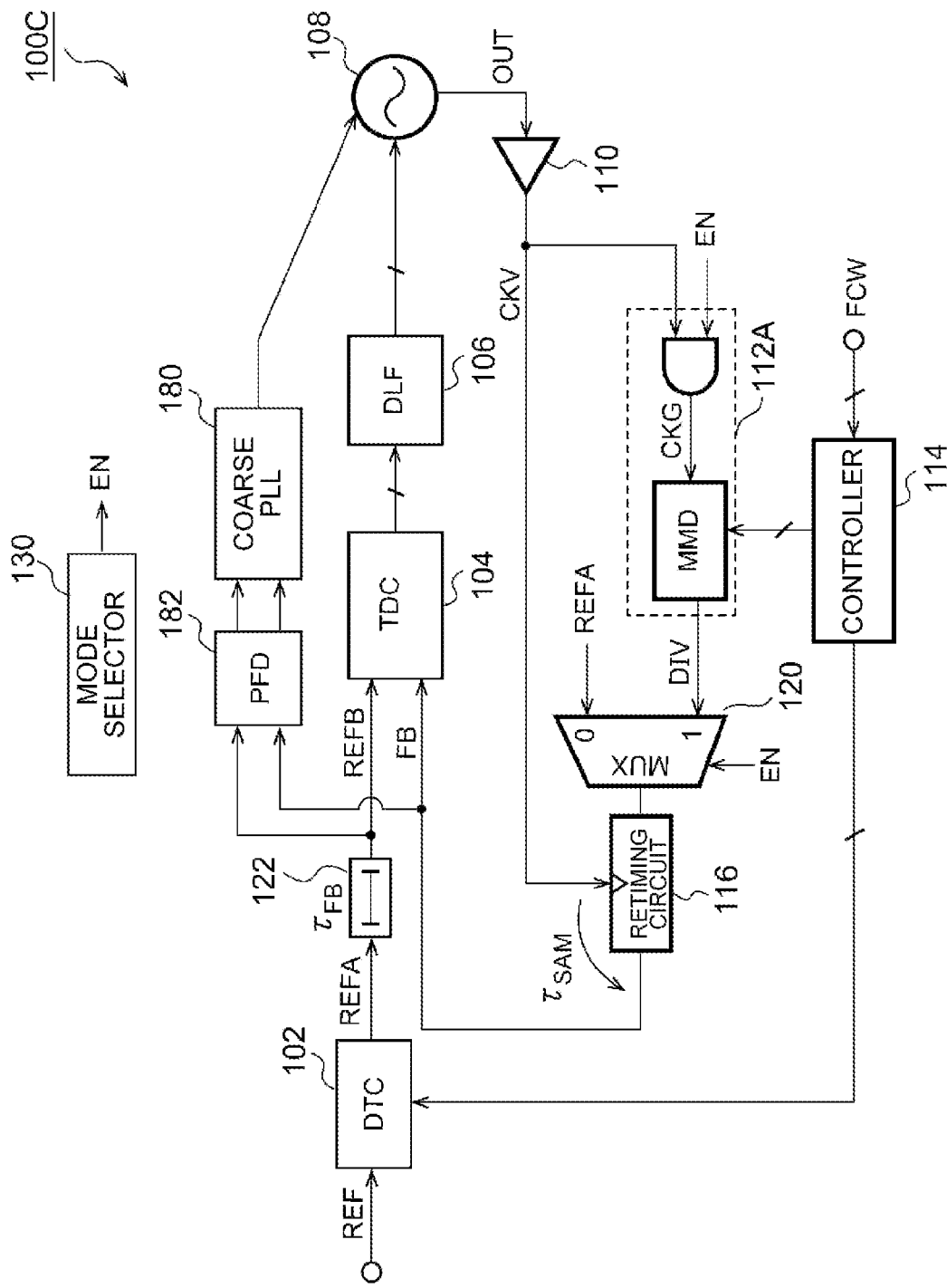
FIG. 13 is a circuit diagram of a D-PLL circuit according to further still another embodiment.

FIG. 13 is a circuit diagram of a D-PLL circuit 100C according to further still another embodiment. In the D-PLL circuit 100C, a coarse second PLL circuit 180 is added. The clock CKG is supplied to the second PLL circuit 180 when the enable signal EN is a high level. The second PLL circuit 180 performs feedback control on the frequency of the DCO 108 based on the output of the PFD 182 (the pulse UP or the pulse DN) while the enable signal EN is a high level, that is, while the second PLL circuit 180 operates in the subsampling mode. That is, the D-PLL circuit 100C of FIG. 13 operates in parallel a high accuracy (fine) feedback loop including the TDC 104 and the DLF 106 and a low accuracy (coarse) feedback loop including the PFD 182 and the second PLL circuit 180. The PFD 142 embedded in the mode selector 130 can be reallocated as the PFD 182. In further still another embodiment, the configuration of the mode selector 130 is not limited, and the configuration of another embodiment, still another embodiment, or the like may be employed.

According to further still another embodiment, the addition of the coarse second PLL 180 can increase the pull-in speed of the phase in the subsampling mode.

Next, modified examples of the D-PLL circuit 100 will be described.

FIRST MODIFIED EXAMPLE

A circuit in which the dead zone detector 140 is omitted from the mode selector 130B of FIG. 10 is also useful as an embodiment. In this case, the error in which the phase lock is not applied may be handled by another method.

SECOND MODIFIED EXAMPLE

In the embodiments, a fractional-N PLL has been described, but the embodiments are not limited to this. The present disclosure is applicable to an integer-N PLL. In this case, the DTC 102 and the controller 114 may be removed and the MMD 112 may be replaced with a mere divider.

THIRD MODIFIED EXAMPLE

The present disclosure is also applicable to analog PLL circuits as well as D-PLL circuits. In this case, the set of the TDC 104, the DLF 106, and the DCO 108 may be replaced by a phase frequency comparator (PFD), a charge pump circuit, an analog loop filter, and a voltage-controlled oscillator (VCO).

(DCO)

Figure 14A:
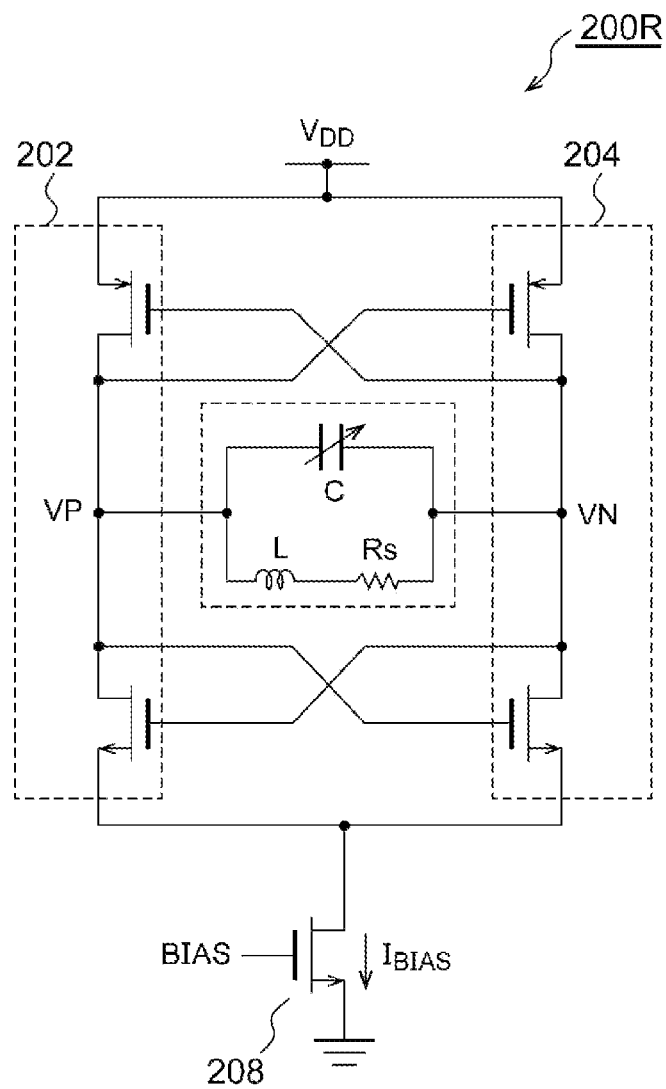
FIG. 14A and FIG. 14B are circuit diagrams of a conventional DCO.
Figure 14B:
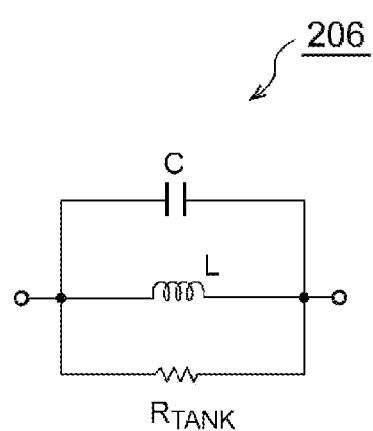

In the D-PLL circuit 100 or in another application, the DCO is an important element technology. FIG. 14A and FIG. 14B are circuit diagrams of a conventional DCO 200R. The DCO 200R is a CMOS oscillator and includes a pair of inverters 202 and 204 with cross-coupled inputs and outputs, a tank circuit 206 provided between the outputs of the pair of inverters 202 and 204, and a current source 208 that provides the bias current to the pair of inverters 202 and 204. The tank circuit 206 is a parallel resonant circuit including an inductor L and a variable capacitor C. A resistor Rs is a series resistive component of the inductor L. The capacitance value of the variable capacitor C is digitally controllable, and the DCO 200R oscillates at an oscillation frequency determined based on the impedance of the tank circuit 206.

FIG. 14B illustrates an equivalent circuit of the tank circuit 206. The equivalent parallel resistor $R_{TANK}$ in the equivalent circuit is defined by $R_{TANK} = \omega L \cdot Q$. Q is a Q value of the LC resonant circuit of FIG. 12, expressed as $Q = \omega L / Rs$.

The amplitude $V_{AMP}$ of the output of the DCO 200R of FIG. 14A is expressed by the equation (1) and is proportional to the equivalent parallel resistor $R_{TANK}$ and the bias current $I_{BIAS}$.

$$V_{AMP} \approx 4/\pi \times R_{TANK} \times I_{BIAS} \qquad (1)$$

To reduce the power consumption of the DCO 200R, it is necessary to reduce the bias current $I_{BIAS}$. However, in order to cause the DCO 200R to stably oscillate, it is necessary to increase the output amplitude $V_{AMP}$ to a certain extent. Therefore, it is necessary to increase the resistor $R_{TANK}$ in exchange for reducing the bias current $I_{BIAS}$. However, if the tank circuit 206 is implemented in a monolithic microwave integrated circuit (MMIC) and integrated in the same chip as the CMOS circuit, the resistance of the $R_{TANK}$ is at most about 200 to 1000Ω.

Thus, the power consumption of the DCO 200R of FIG. 14A is constrained by the impedance of the tank circuit. In the following, a novel DCO that can further reduce power consumption will be described.

Figure 15:
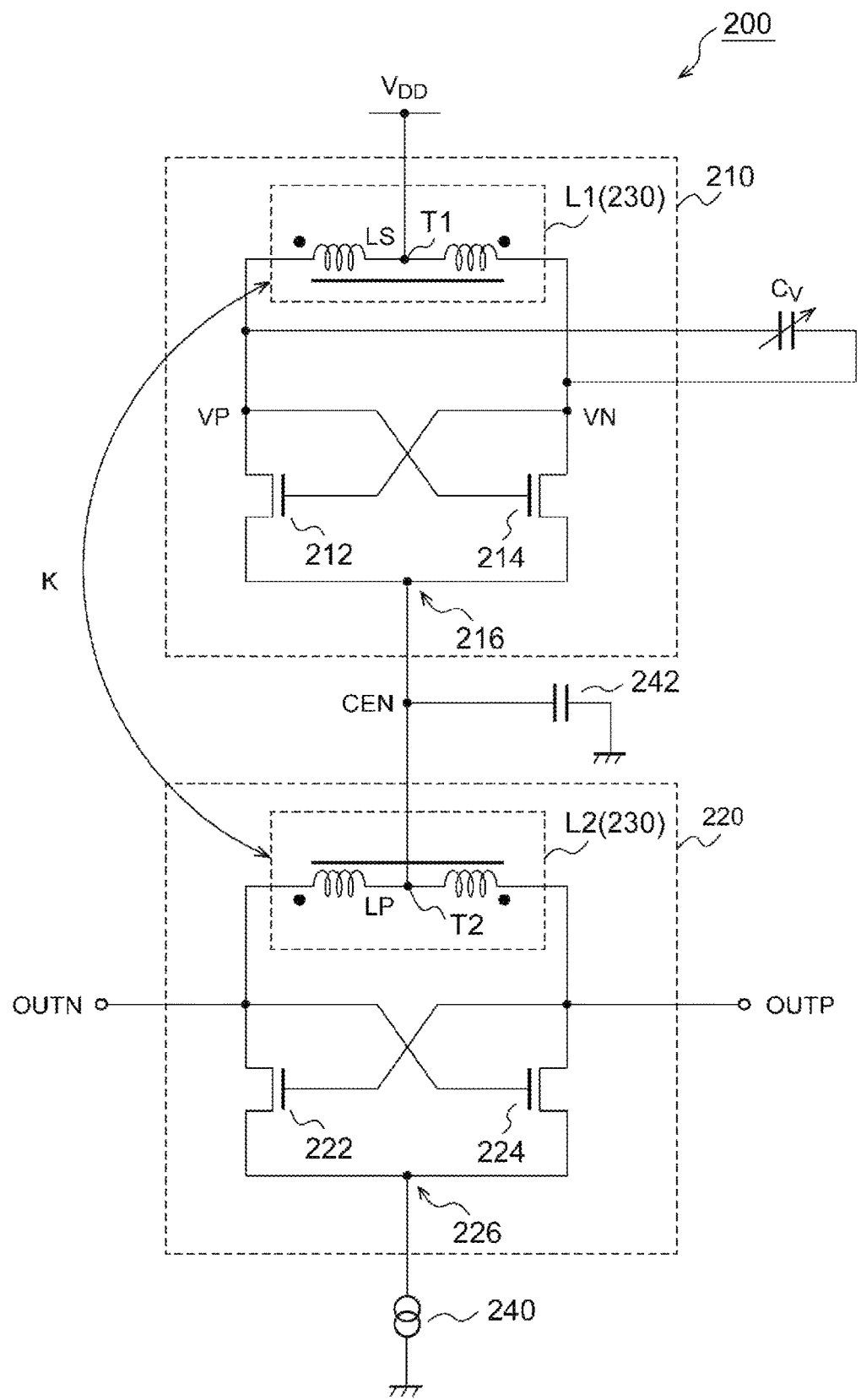
FIG. 15 is a circuit diagram illustrating a basic architecture of a DCO according to an embodiment.

FIG. 15 is a circuit diagram illustrating a basic architecture of a DCO 200 according to an embodiment. The DCO 200 includes an upper unit 210 and a lower unit 220. The upper unit 210 includes a pair of circuit elements 212 and 214 that are cross-coupled, and an inductor (primary winding) L1 with a tap T1. The inductor L1 is connected between the outputs (the inputs) of the pair of circuit elements 212 and 214. The tap T1 of the inductor L1 is connected directly to a power source of a voltage $V_{DD}$, or a bias current source is connected as described below.

In FIG. 15, the circuit elements 212 and 214 are NMOS transistors, and the sources of the NMOS transistors are connected to a reference node 216.

Similarly, the lower unit 220 includes a pair of circuit elements 222 and 224 that are cross-coupled, and an inductor L2 (secondary winding) with a tap T2. The inductor L2 is connected between the outputs (the inputs) of the pair of circuit elements 222 and 224.

The tap T2 of the lower unit 220 is connected to the reference node 216 of the upper unit 210. The reference node 216 is connected to a capacitor 242 and is a virtual ground. This node is referred to as a CEN.

The circuit elements 222 and 224 are also NMOS transistors, and the sources of the NMOS transistors are commonly connected. The sources of the NMOS transistors, which are circuit elements 222 and 224, are connected to a reference node 226. The reference node 226 is connected to a bias current source 240.

As with the upper unit 210 and the lower unit 220 of FIG. 15, cross-coupled circuit elements being NMOS transistors are referred to as an N-type unit.

The inductor L1 of the upper unit 210 and the inductor L2 of the lower unit 220 are coupled to form a trans-configuration 230. The coupling coefficient of a winding wire Ls of the inductor L1 and a winding wire Lp of the inductor L2 is k.

A variable capacitor Cv is connected to the upper unit 210. The variable capacitor Cv forms an LC tank circuit with the trans-configuration 230, and the DCO 200 oscillates at a frequency determined based on a capacitance value of the variable capacitor Cv. Although a position from which the output is taken is not particularly limited, the output may be taken from, for example, the drains of the NMOS transistors, which are circuit elements 222 and 224, of the lower unit 220.

Figure 16:
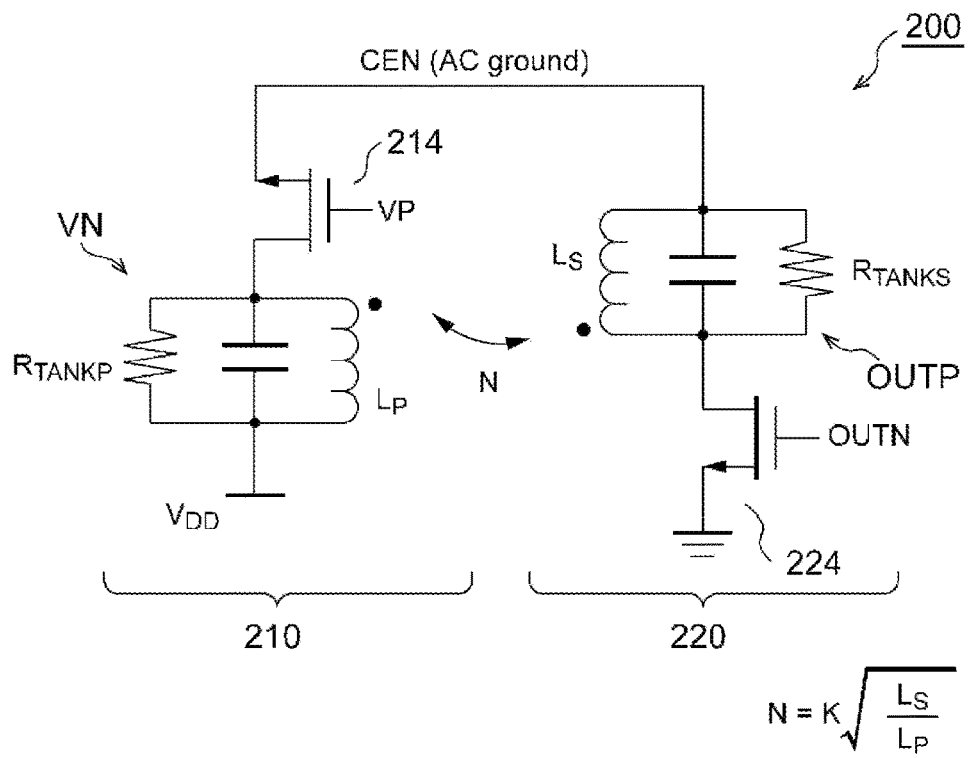
FIG. 16 is an equivalent circuit diagram of the DCO of FIG. 15.

The basic configuration of the DCO 200 has been described above. Next, the operation will be described. FIG. 16 is an equivalent circuit diagram of the DCO 200 of FIG. 15. N is a passive gain that is expressed as $N=k\sqrt{(Ls/Lp)}$ by using the coupling coefficient k.

In FIG. 16, the amplitude $V_{AMP}$ of an output signal OUTP is expressed by the equation (2).

$$V_{AMP}=4/\pi \times I_{BIAS} \times R_{TANKP} \times G_{TF} \qquad (2)$$

The $G_{TF}$ is the gain caused by the trans-configuration 230 and is represented by the equation (3).

$$G_{TF}=k2 \cdot Ls/Lp+k\sqrt{(Ls/Lp)}+R_{TANKS}/R_{TANKP} \qquad (3)$$

The $G_{TF}$ can be 2 or greater, and, for example, in the circuit designed by the inventors, $G_{TF}$ is 4.35.

Figure 17:
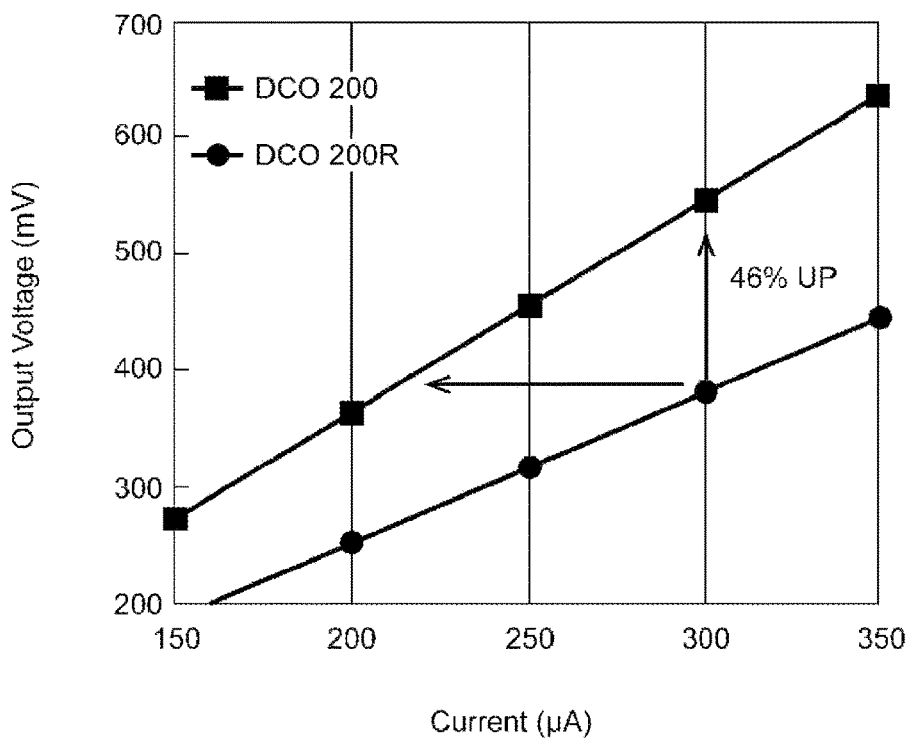
FIG. 17 is a graph illustrating a relation between a bias current $I_{BIAS}$ and an amplitude $V_{AMP}$ of an output signal.

FIG. 17 is a graph illustrating a relation between the bias current $I_{BIAS}$ and the amplitude $V_{AMP}$ of the output signal (simulation). The line with square dots illustrates characteristics of the DCO 200 in FIG. 15, and the line with round dots illustrates characteristics of the conventional DCO 200R. Comparing the characteristics at the same bias current, the amplitude can be increased by 46% in comparison with the conventional DCO 200 in FIG. 15. In other words, the bias current required to obtain the same amplitude can be significantly reduced.

Next, a modified example of the DCO 200 will be described.

Figure 18:
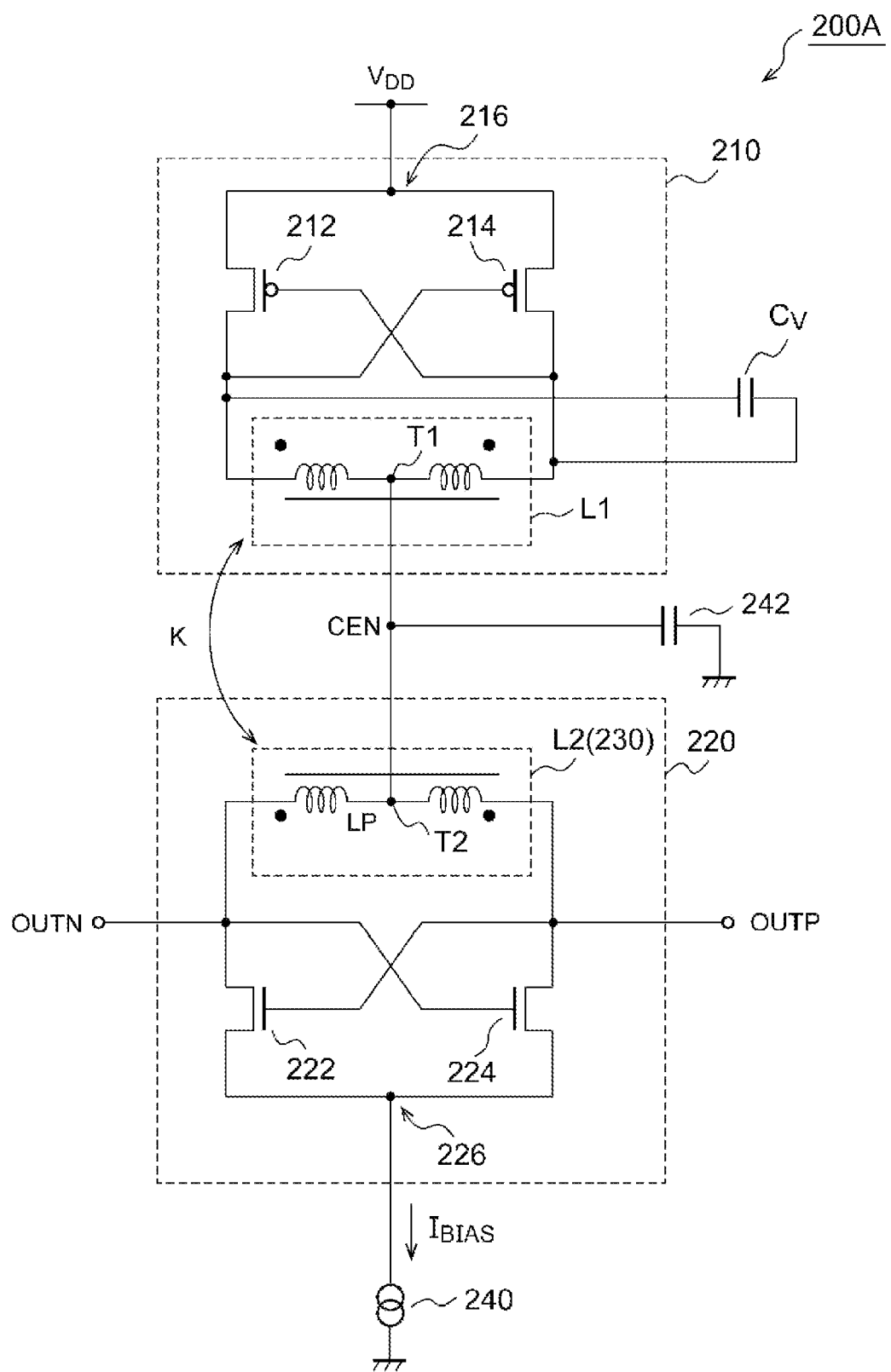
FIG. 18 is a circuit diagram of a DCO according to a first modified example.

FIG. 18 is a circuit diagram of a DCO 200A according to a first modified example of the DCO 200. In the first modified example, the lower unit 220 is of the N-type, as with the lower unit 220 in FIG. 15, but the upper unit 210 is replaced with a P-type unit.

The P-type unit is configured such that the pair of circuit elements 212 and 214 in the N-type unit is replaced by the PMOS transistors and the N-type unit is turned upside down. Specifically, the inductor L1 is connected between the drains of the PMOS transistors, which replace the pair of circuit elements 212 and 214, and the tap of the inductor L1 is connected to the virtual ground line CEN. The sources of the PMOS transistors become the reference node 216 and the power source voltage $V_{DD}$ is provided.

Figure 19:
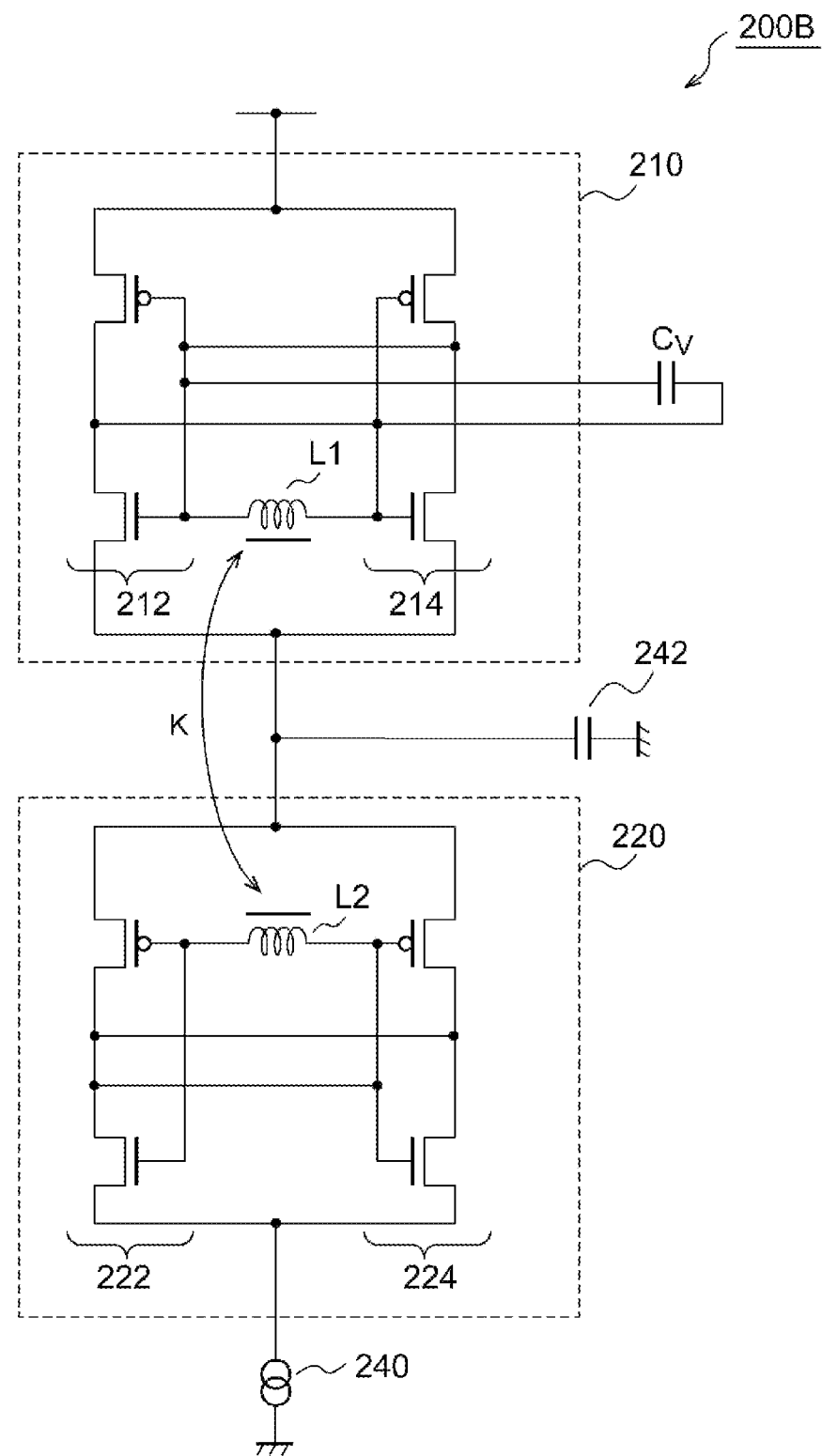
FIG. 19 is a circuit diagram of a DCO according to a second modified example.

FIG. 19 is a circuit diagram of a DCO 200B according to a second modified example of the DCO 200. In the second modified example, the upper unit 210 and the lower unit 220 are CMOS-type (push-pull-type) units.

The CMOS type unit is configured such that a pair of cross-coupled circuit elements is a CMOS inverter. The tap of the inductor L may be omitted.

FIGS. 20A to 20F are circuit diagrams illustrating additional modified examples of the DCO 200. In FIGS. 20A to 20F, N represents an N-type unit, P represents a P-type unit, and C represents a CMOS-type unit.

The combination of the upper unit 210 and the lower unit 220 is not limited to those described above. In FIG. 20A, the upper unit 210 is of a CMOS type, and the lower unit 220 is of an NMOS type. In FIG. 20B, both the upper unit 210 and the lower unit 220 are of a PMOS type. In FIG. 20C, the upper unit 210 is of an NMOS type and the lower unit 220 is of a CMOS type. In FIG. 20D, the upper unit 210 is of a PMOS type and the lower unit 220 is of a CMOS type.

As illustrated in FIG. 20E, the bias current source 240 may be omitted. As illustrated in FIG. 20F, the bias current source 240 may be provided on the power supply side.

Additionally, the output signal of the DCO 200 may be taken from the upper unit 210 side or from the lower unit 220 side. Additionally, the variable capacitor Cv may be connected to the lower unit 220.

(DTC)

In the D-PLL circuit 100, or in other applications, a digital-to-time converter (DTC) is also an important element technology.

Figure 21:
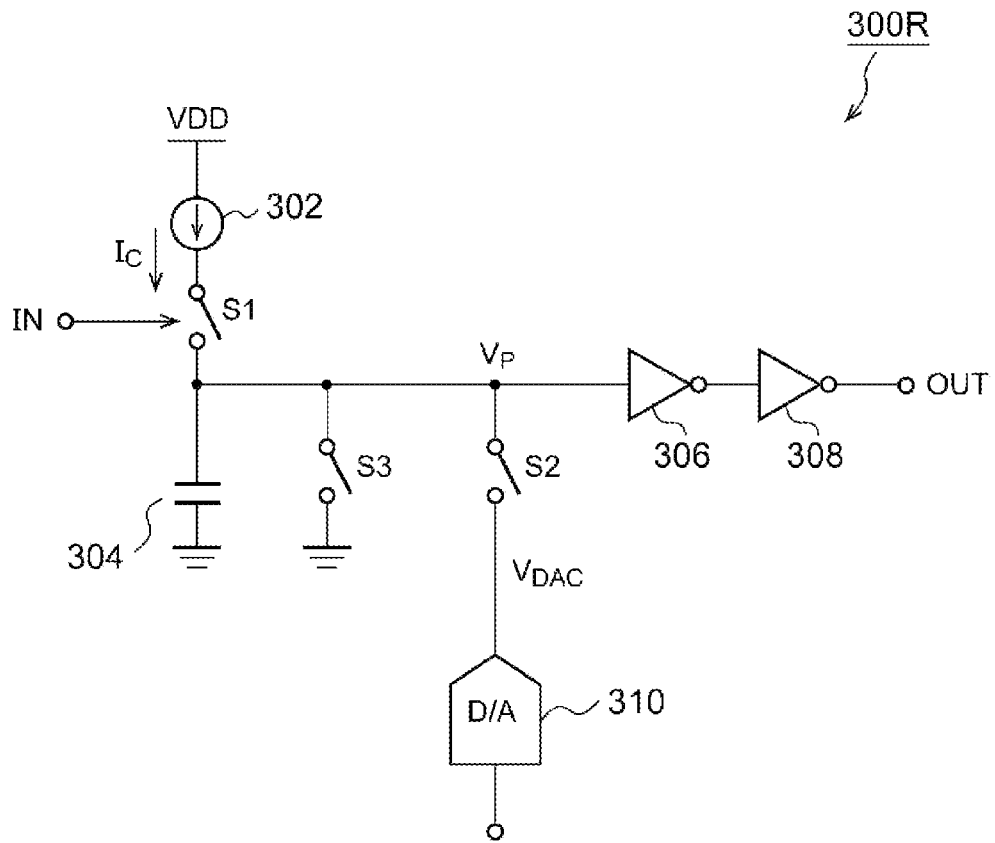
FIG. 21 is a circuit diagram of a conventional DTC.

FIG. 21 is a circuit diagram of a conventional DTC 300R. The DTC 300R may be referred to as a single slope DTC. The DTC 300R includes a charge circuit 302, a capacitor 304, switches S1-S3, inverters 306 and 308, and a D/A converter (DAC) 310. The DTC 300R applies a delay determined based on a digital control code CODE to an input signal IN and output an output signal. The DAC 310 outputs an analog voltage $V_{DAC}$ determined based on the control code CODE. The charge circuit 302 charges the capacitor 304 in a state in which the first switch S1 is on. The inverter 306 functions as a comparing unit (a comparing circuit) that compares the voltage $V_P$ of the capacitor 304 with a threshold $V_{TH}$ (=$V_{DD}$/2). The capacitor 304 is discharged in a state in which the third switch S3 is on and the voltage $V_P$ is initialized.

Figure 22:
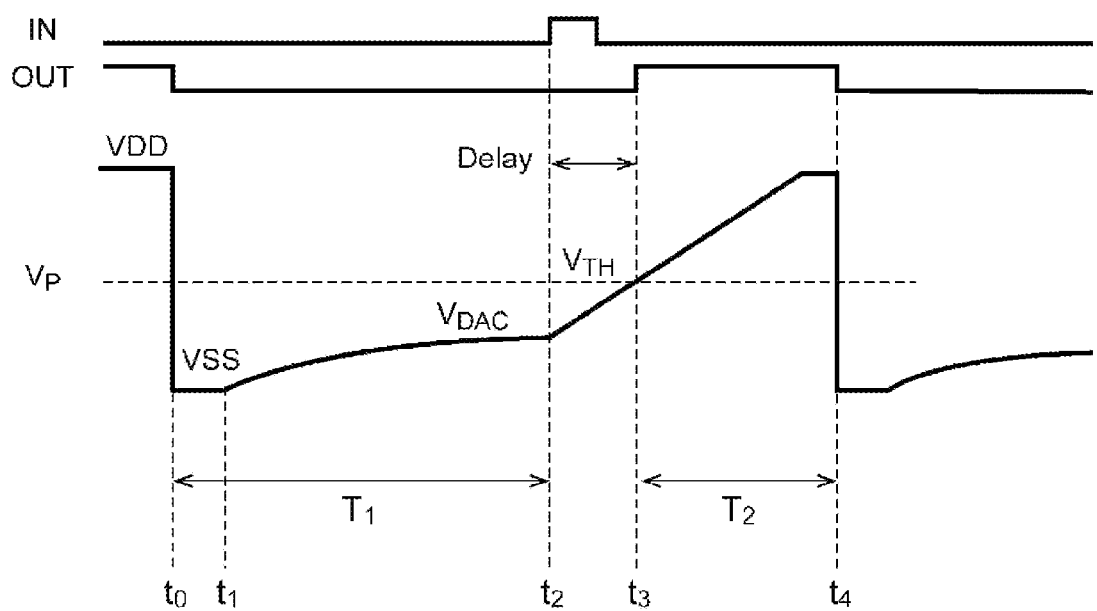
FIG. 22 is an operating waveform chart of the DTC of FIG. 21.

FIG. 22 is an operating waveform chart of the DTC 300R of FIG. 21. At the time t0, the third switch S3 is turned on, the capacitor 304 is discharged and the voltage $V_P$ is initialized.

At the time $t_1$, the second switch S2 is turned on and the capacitor 304 is charged by the output voltage $V_{DAC}$ of the DAC 310. This leads to a state of $V_P=V_{DAC}$.

At the time $t_2$, in response to the transition of the input signal IN, the first switch S1 is turned on. As a result, the capacitor 304 is charged by the current $I_C$ of the charge circuit 302 and the voltage $V_P$ linearly increases.

When the voltage $V_P$ reaches the threshold $V_{TH}$ at the time t3, the output clock OUT changes. The delay amount τ of the output clock OUT for the input signal IN is the following.

$$\tau=(V_{TH}-V_{DAC})\times C/I_C$$

C is the capacitance of the capacitor 304.

The inventors of the present disclosure have recognized the following problems, as a result of studying the DTC 300R illustrated in FIG. 21.

That is, as can be found from the time chart of FIG. 22, only part of the current generated by the charge circuit 302 contributes to the delay, and the rest is wasted. The inventors have found that 58% of the power is consumed by the current source during the time period $T_1$ and the time period $T_2$.

In other words, there is room to reduce power consumption in the DTC 300R. In the following, a DTC of which power consumption is reduced will be described.

Figure 23:
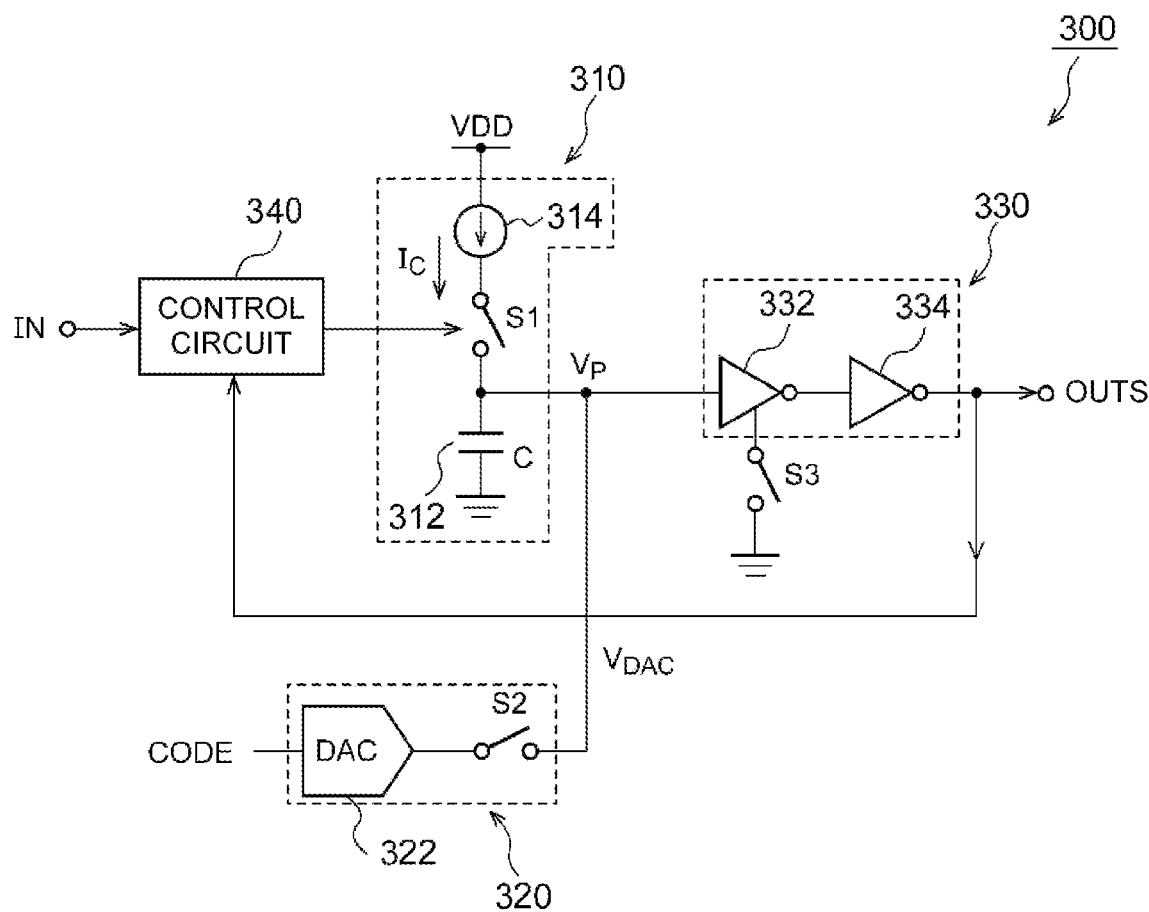
FIG. 23 is a circuit diagram of a DTC according to an embodiment.

FIG. 23 is a circuit diagram of the DTC 300 according to an embodiment. The DTC 300 includes a slope generation circuit 310, a precharge circuit 320, a comparing unit 330, and a control circuit 340.

The slope generation circuit 310 includes a capacitor 312, a current source 314, and a first switch S1. The current source 314 supplies the constant current Ic to the capacitor 312 and generates a slope voltage $V_P$ that varies in a constant slope for the capacitor 312. The first switch S1 is provided to cut off the constant current Ic. The first switch S1 may be integrated in the current source 314.

The precharge circuit 320 applies the analog voltage $V_{DAC}$, determined based on the control code CODE, to the capacitor 312. The precharge circuit 320 includes a D/A converter 322 and the second switch S2. When the second switch S2 is on, the output voltage $V_{DAC}$ of the D/A converter 322 is applied to the capacitor 312 and when the second switch S2 is off, the D/A converter 322 is disconnected from the capacitor 312. Here, if the D/A converter 322 can take a state in which the output is a high impedance, the second switch S2 may be omitted and a state in which the second switch S2 is off may be achieved by controlling the D/A converter 322.

The comparing unit 330 compares the slope voltage $V_P$ generated for the capacitor 312 with the threshold $V_{TH}$, and generates an output signal OUTS based on a comparison result. The comparing unit 330 may include two-stage inverters 332 and 334 connected in cascade. The slope voltage $V_P$ is compared with a threshold of the inverter 332 and converted to a binary signal based on a comparison result by the first stage inverter 332. The second stage inverter 334 is provided to convert the logical value of the signal and/or provide a low impedance sufficient to drive the load.

Preferably, the comparing unit 330 is configured to switch between on and off. For this purpose, the third switch S3 is provided. The third switch S3 is provided between the inverter 332 and the ground. The third switch S3 may be inserted on the power line side.

The control circuit 340 controls the slope generation circuit 310 and the precharge circuit 320 in response to the transition of the input signal IN and the output signal OUTS.

The control circuit 340 turns on the precharge circuit 320 during the precharge period. Specifically, the second switch S2 is turned on. This allows the capacitor 312 to be charged by the voltage $V_{DAC}$. The length of the precharge period may be determined by considering the output impedance of the D/A converter 322 and the time constant determined based on the capacitance of the capacitor 312, i.e., the time required for charging.

Additionally, the control circuit 340 turns off the comparing unit 330 during the precharge period. Specifically, the third switch S3 is turned off.

The control circuit 340 also transitions to a slope period in response to the transition of the input signal IN. The control circuit 340 turns off the precharge circuit 320 and turns on the slope generation circuit 310 during the slope period. Specifically, the second switch S2 is turned off, the first switch S1 is turned on, and the third switch S3 is turned off.

During the slope period, the slope voltage $V_P$ varies with a constant slope after the slope generation circuit 310 is turned on. Then, when the slope voltage $V_P$ crosses the threshold $V_{TH}$, the output signal OUTS is transitioned.

The control circuit 340 turns off the slope generation circuit 310 in response to the transition of the output signal OUTS and cuts off the constant current $I_C$. The control circuit 340 repeats this series of operations.

Figure 24:
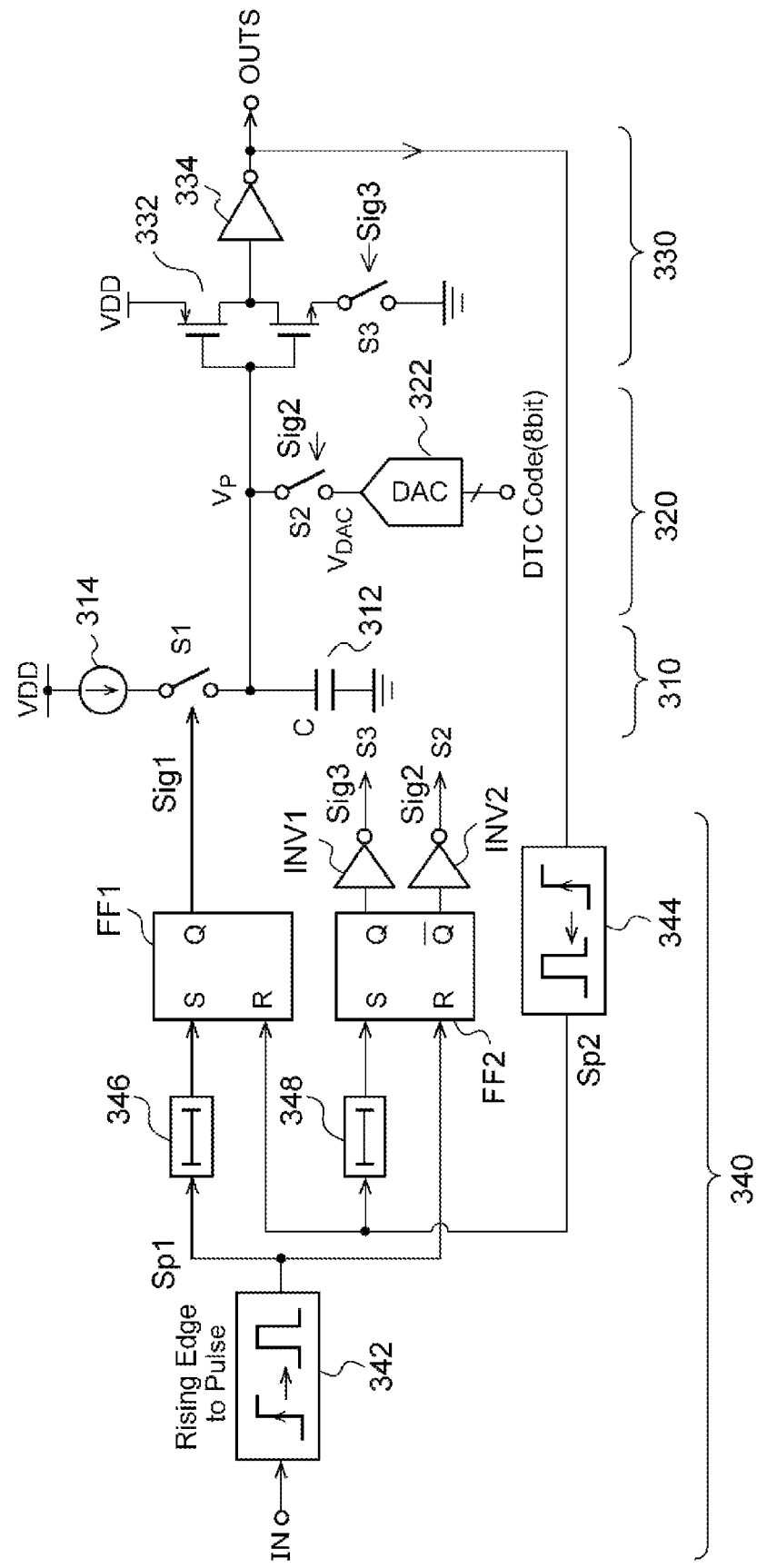
FIG. 24 is a circuit diagram illustrating a configuration example of a control circuit.

FIG. 24 is a circuit diagram illustrating a configuration example of the control circuit 340. The control circuit 340 is formed of logic circuits. The control circuit 340 includes a first edge detection circuit 342, a second edge detection circuit 344, a first delay circuit 346, a second delay circuit 348, a first flip-flop FF1, a second flip-flop FF2, a first inverter INV1, and a second inverter INV2.

The first edge detection circuit 342 generates a first pulse signal Sp1 having a predetermined pulse width in response to a positive edge of the input signal IN (also referred to as a rising edge or leading edge). The second edge detection circuit 344 generates a second pulse signal Sp2 having a predetermined pulse width in response to a positive edge of the output signal OUTS.

The first delay circuit 346 delays the first pulse signal Sp1 by the delay amount T1 and supplies the delayed signal to a set terminal S of the first flip-flop FF1. With the delay amount T1, it is ensured that the first switch S1 is turned on in a situation in which the voltage can be compared after the third switch S3 is turned on. Additionally, the second pulse signal Sp2 is input to a reset terminal R of the first flip-flop FF1. On and off of the first switch S1 is controlled by an output signal Sig1 of the first flip-flop FF1.

The second delay circuit 348 delays the second pulse signal Sp2 by a delay amount τ2 and supplies the delayed signal to a set terminal of the second flip-flop FF2. After the capacitor voltage $V_P$ reaches the threshold $V_{TH}$, there are delays of two stages, which are the inverter 332 and the inverter 334, before the output signal OUTS fully rises to a high level (VDD). Thus, the third switch S3 can be turned off after the output signal OUTS has completely risen to a high level (VDD) by introducing the delay amount 12.

The first pulse signal Sp1 is input to a reset terminal of the second flip-flop FF2. The second switch S2 and the third switch S3 are controlled based on a state of the second flip-flop FF2. Specifically, an inverted signal Sig3 of an output Q of the second flip-flop FF2 is supplied to the third switch S3, and the inverted signal Sig2 of an inverted output QB of the second flip-flop FF2 is supplied to the second switch S2.

The second flip-flop FF2 is reset at the timing of the negative edge of the first pulse signal Sp1. Therefore, the timing at which the second switch S2 turns on and the third switch S3 turns off is defined by the pulse width of the first pulse signal Sp1.

Figure 25:
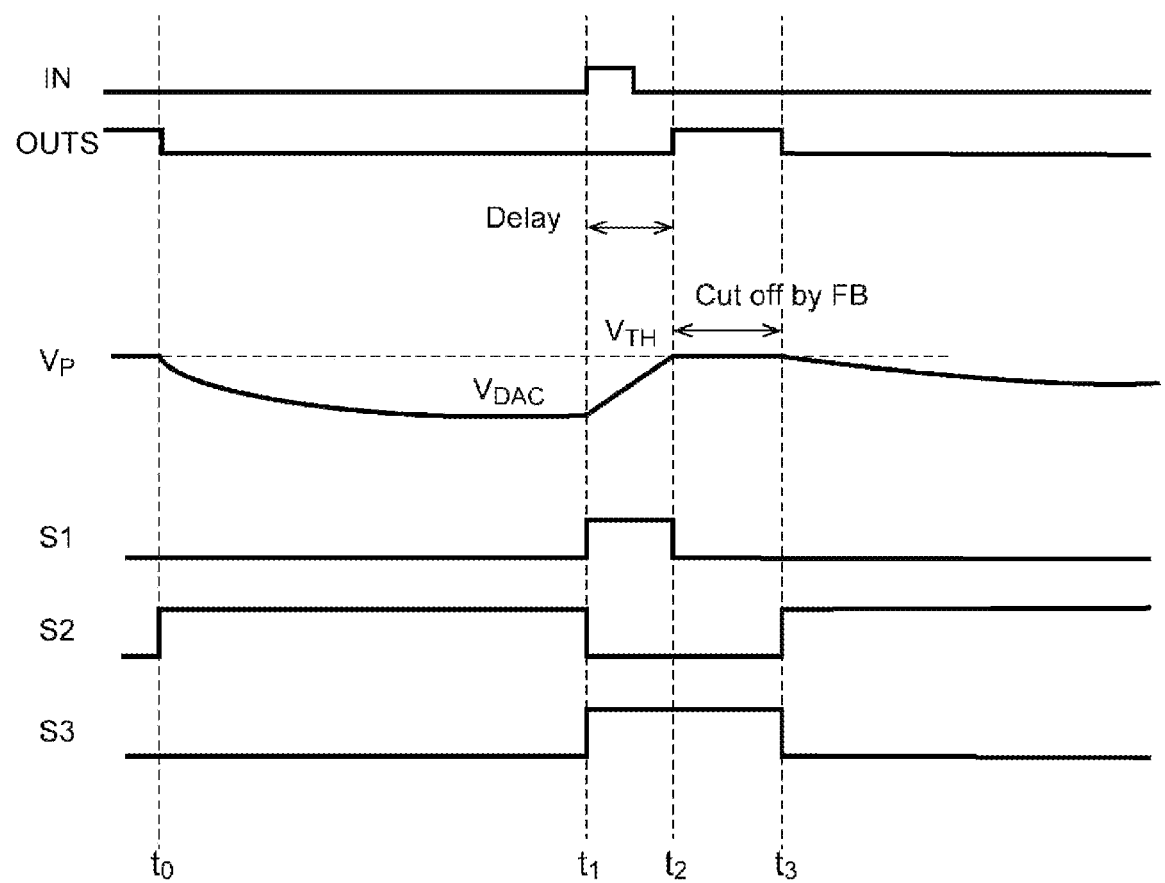
FIG. 25 is a time chart illustrating an operation of the DTC of FIG. 23.

The configuration of the DTC 300 has been described above. Next, the operation will be described. FIG. 25 is a time chart illustrating the operation of the DTC 300 of FIG. 23.

At the time t0, the second switch S2 is turned on and the capacitor 312 is charged by the DAC 310. Consequently, the voltage $V_P$ of the capacitor becomes a voltage value $V_{DAC}$ determined based on the control code.

When the input signal IN is transitioned to a high level at the time t1, the first switch S1 is turned on, the capacitor 312 is charged by the current $I_C$ generated by the current source 314, and the voltage $V_P$ of the capacitor 312 increases at a constant slope. At this time, the third switch S3 is also turned on, and the inverter 306 becomes in a state in which the voltage can be compared.

When the voltage $V_P$ reaches the threshold $V_{TH}$ at the time t2, the output signal OUTS transitions to a high level. In response to this, the control circuit 340 turns off the first switch S1. As a result, the charging of the capacitor 312 is stopped. As a result, the voltage $V_P$ is maintained near the threshold $V_{TH}$. Subsequently, the second switch S2 is turned on and the third switch S3 is turned off at the time t3 after the time period corresponding to the amount of delay of the second delay circuit 348 has lapsed. This is one cycle of the operation. Next, the advantage will be described.

Figure 26:
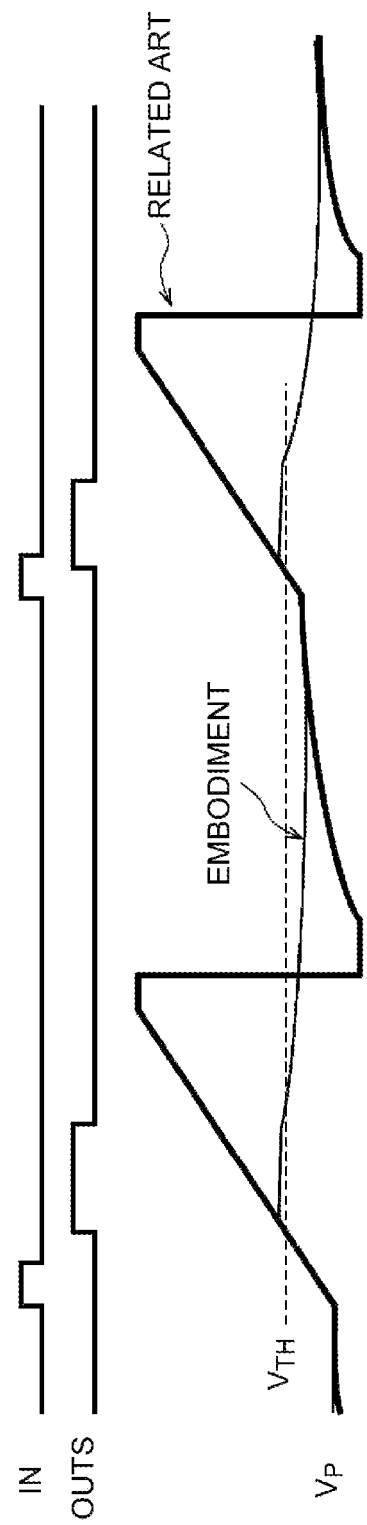
FIG. 26 is a chart illustrating an operating waveform of the DTC according to the embodiment and an operating waveform of the conventional DTC.

FIG. 26 is a chart illustrating an operating waveform of the DTC according to the present embodiment and an operating waveform of the conventional DTC. In the present embodiment, the variation of the voltage $V_P$ of the capacitor 312 is minimized in comparison with the conventional DTC. That is, wasted supply of the charge to the capacitor 312, and wasted discharge of the charge from the capacitor 312 can be reduced, thereby reducing the power consumption. In particular, in the present embodiment, the first switch S1 is on only during the slope period. In other words, 100% of the current $I_C$ generated by the current source 314 is used to generate the slope voltage, thereby reducing the power consumption.

Additionally, the third switch S3 is disposed on the path of the inverter 306 and is turned on only during the time period in which the voltage is compared. This prevents the flow-through current from flowing through the inverter 306 when the output voltage $V_{DAC}$ of the DAC 310 is close to the threshold $V_{TH}$ of the inverter 306 (the comparing unit), thereby reducing the power consumption.

In FIG. 23, the comparing unit 330 may be a voltage comparator. In this case, the third switch S3 may be incorporated into the voltage comparator and the bias current of the voltage comparator may be blocked.

Although the disclosure has been described based on the embodiments by using specific terms, the embodiments merely indicate the principles and applications of the disclosure, and many modifications and changes of arrangement can be made to the embodiments without departing from the spirit of the invention recited in the claims.

INDUSTRIAL APPLICABILITY

The present disclosure is applicable to electronic circuitry.

What is claimed is:

1. A phase locked loop circuit that receives a first reference clock and generates an output clock, the phase locked loop circuit comprising:
   a delay circuit configured to delay the first reference clock to generate a second reference clock;
   a feedback circuit configured to generate a control signal based on a phase difference between the second reference clock and a feedback clock;
   an oscillator configured to oscillate at a frequency determined based on the control signal to generate the output clock; and
   a divider configured to switch between an on state and an off state, and divide the output clock in the on state,
   wherein the phase locked loop circuit is configured to switch between a first mode and a second mode, the feedback clock in the first mode is a signal obtained by retiming an output of the divider with the output clock, and the feedback clock in the second mode is a signal obtained by retiming the first reference clock with the output clock.

2. The phase locked loop circuit as claimed in claim 1, further comprising:
   a mode controller configured to generate an enable signal indicating the first mode or the second mode;
   a multiplexer configured to receive the output of the divider and the first reference clock and select either the output of the divider or the first reference clock based on the enable signal; and
   a retiming circuit configured to retime an output of the multiplexer with the output clock,
   wherein the on state and the off state of the divider are switched based on the enable signal, and an output of the retiming circuit is the feedback clock.

3. The phase locked loop circuit as claimed in claim 1, further comprising a dead zone detector configured to determine whether phase error between the second reference clock and the feedback clock is within a dead zone,
   wherein the first mode and the second mode are switched based on an output of the dead zone detector.

4. The phase locked loop circuit as claimed in claim 3, wherein the dead zone detector includes
   a phase frequency detector configured to compare phases or frequencies of the second reference clock and the feedback clock and output a pulse based on a comparison result, and
   a determining unit configured to generate the phase error based on an output of the phase frequency detector and determine whether the phase error is within the dead zone.

5. The phase locked loop circuit as claimed in claim 1, further comprising a frequency lock loop configured to monitor a relation between a frequency of the output clock and a frequency of the first reference clock, and detect a frequency error in which the frequency of the output clock deviates from a target frequency determined based on a frequency division ratio used by the divider, wherein the first mode and the second mode are switched based on an output of the frequency lock loop.

6. The phase locked loop circuit as claimed in claim 5, wherein the frequency lock loop includes a counter that counts the output clock during a time period that is K times greater than a period of the first reference clock (where K is an integer), and detects the frequency error based on a count value of the counter and a value obtained by multiplying a frequency multiplication ratio by K, the frequency multiplication ratio being a reciprocal of the frequency division ratio.

7. The phase locked loop circuit as claimed in claim 6, further comprising a duty cycle controller configured to generate a control pulse having a predetermined duty cycle, wherein the frequency lock loop operates intermittently in response to the control pulse.

8. The phase locked loop circuit as claimed in claim 1, further comprising:
   a phase frequency detector configured to compare phases or frequencies of the second reference clock and the feedback clock, and output a pulse based on a comparison result; and
   a coarse phase locked loop circuit configured to operate in the first mode and perform feedback control on the frequency of the oscillator based on the pulse output by the phase frequency detector,
   wherein an accuracy of a feedback loop including the phase frequency detector and the coarse phase locked loop is coarser than an accuracy of the feedback circuit.

9. The phase locked loop circuit as claimed in claim 1, wherein the phase locked loop circuit is a digital phase locked loop circuit,
   wherein the feedback circuit includes a time-to-digital convertor that converts the phase difference between the second reference clock and the feedback clock into a digital signal, and
   wherein the oscillator is a digitally-controlled oscillator that oscillates at a frequency determined based on the digital signal output by the time-to-digital convertor.

10. The phase locked loop circuit as claimed in claim 9, wherein the digitally-controlled oscillator includes:
    an upper unit and a lower unit that are connected in series between a power line and a ground line; and
    a variable capacitor that is connected to at least one of the upper unit and the lower unit,
    wherein each of the upper unit and the lower unit includes a pair of cross-coupled circuit elements and an inductor connected to the pair of cross-coupled circuit elements, and
    wherein the inductor of the upper unit and the inductor of the lower unit are combined to form a trans-configuration.

11. The phase locked loop circuit as claimed in claim 9, wherein the phase locked loop circuit is a fractional-N phase locked loop circuit,
    wherein the divider is a multi-modulus divider, and
    wherein the phase locked loop circuit comprises:
       a digital-to-time convertor configured to receive an input reference clock and generate the first reference clock; and
       a controller configured to control the digital-to-time convertor and the multi-modulus divider based on a frequency control word indicating the frequency of the output clock.

12. The phase locked loop circuit as claimed in claim 11, wherein the digital-to-time convertor includes:

a slope generating circuit configured to generate a slope voltage, the slope generating circuit including a capacitor and a current source;
a precharge circuit configured to apply an analog voltage, determined based on a control code, to the capacitor;
a comparing circuit configured to compare the slope voltage with a threshold value and generate the first reference clock based on a comparison result; and
a control circuit configured to control the slope generating circuit and the precharge circuit based on the input reference clock and the first reference clock, and
wherein the control circuit repeats the following operations:
   turning on the precharge circuit during a precharge period;
   transitioning to a slope period in response to transition of the input reference clock, turning off the precharge circuit during the slope period, and turning on the slope generating circuit; and
   turning off the slope generating circuit in response to transition of the first reference clock.

13. A digitally-controlled oscillator comprising:
   an upper unit and a lower unit that are connected in series between a power line and a ground line; and
   a variable capacitor that is connected to at least one of the upper unit and the lower unit,
   wherein each of the upper unit and the lower unit includes a pair of circuit elements that are cross-coupled and an inductor connected to the pair of circuit elements,
   wherein the inductor of the upper unit and the inductor of the lower unit are combined to form a trans-configuration, and
   wherein the digitally-controlled oscillator further comprises a capacitor that is connected to a connection node of the upper unit and the lower unit, the connection node being a virtual ground node of the upper unit.

14. The digitally-controlled oscillator as claimed in claim 13, wherein at least one of the upper unit and the lower unit is an N-channel metal oxide semiconductor (NMOS) unit in which the pair of circuit elements is a pair of NMOS transistors.

15. The digitally-controlled oscillator as claimed in claim 14, wherein each of the upper unit and the lower unit is the NMOS unit.

16. The digitally-controlled oscillator as claimed in claim 13, wherein at least one of the upper unit and the lower unit is a P-channel metal oxide semiconductor (PMOS) unit in which the pair of circuit elements is a pair of PMOS transistors.

17. The digitally-controlled oscillator as claimed in claim 13, wherein at least one of the upper unit and the lower unit is a complementary metal oxide semiconductor (CMOS) unit in which the pair of circuit elements is a pair of CMOS inverters.

18. The digitally-controlled oscillator as claimed in claim 13, further comprising a bias current source that is inserted between the power line and the ground line.

19. The digitally-controlled oscillator as claimed in claim 13, further comprising a capacitor that is connected to a connection node of the upper unit and the lower unit.

20. A digital-to-time convertor that receives an input signal and applies a delay corresponding to a control code to generate an output signal, the digital-to-time convertor comprising:

a slope generating circuit configured to generate a slope voltage, the slope generating circuit including a capacitor and a current source;

a precharge circuit configured to apply an analog voltage, determined based on the control code, to the control code to the capacitor;

a comparing circuit configured to compare the slope voltage with a threshold value and generate the output signal based on a comparison result; and a control circuit configured to control the slope generating circuit and the precharge circuit based on the input signal and the output signal, wherein the control circuit repeats the following operations:

turning on the precharge circuit during a precharge period;

transitioning to a slope period in response to transition of the input signal with the precharge circuit being off and the slope generating circuit being on during the slope period; and turning off the slope generating circuit in response to transition of the output signal.

21. The digital-to-time convertor as claimed in claim 20, wherein the comparing circuit is configured to be turned on and off and the control circuit turns off the comparing circuit during the precharge period.

* * * * *